(12) United States Patent
Statnikov et al.

(10) Patent No.: US 7,276,824 B2
(45) Date of Patent: Oct. 2, 2007

(54) OSCILLATING SYSTEM AND TOOL FOR ULTRASONIC IMPACT TREATMENT

(75) Inventors: Efim S. Statnikov, Birmingham, AL (US); Oleg V. Korolkov, Severodvinsk (RU); Voldemar O. Muktepavel, Severodvinsk (RU); Vladislav Y. Korostel, Severodvinsk (RU)

(73) Assignee: U.I.T., L.L.C., Birmingham, AL (US)

( * ) Notice: Subject to any disclaimer, the term of this patent is extended or adjusted under 35 U.S.C. 154(b) by 0 days.

(21) Appl. No.: 11/312,382

(22) Filed: Dec. 21, 2005

(65) Prior Publication Data

US 2007/0040476 A1    Feb. 22, 2007

Related U.S. Application Data

(63) Continuation-in-part of application No. 11/206,906, filed on Aug. 19, 2005, now abandoned.

(51) Int. Cl.
    *H01L 41/08*    (2006.01)
(52) U.S. Cl. .......................................... 310/26; 310/325
(58) Field of Classification Search .................. 310/26, 310/323.01, 325, 328
See application file for complete search history.

(56) References Cited

U.S. PATENT DOCUMENTS

| | | |
|---|---|---|
| RE16,599 E | 4/1927 | Mattice |
| 1,703,111 A | 2/1929 | Kniatt |
| 1,770,932 A | 7/1930 | Leake |
| 2,537,533 A | 1/1951 | Ingalls |
| 3,210,843 A | 10/1965 | Seul et al. |
| 3,274,033 A | 9/1966 | Jacke |
| 3,622,404 A | 11/1971 | Thompson |
| 3,650,016 A | 3/1972 | McMaster |
| 3,782,160 A | 1/1974 | Kheifets et al. |
| 3,864,542 A | 2/1975 | Fletcher et al. |
| 3,945,098 A | 3/1976 | Yascheritsyn et al. |
| 3,961,739 A | 6/1976 | Leftheris |
| 4,049,186 A | 9/1977 | Hanneman et al. |
| 4,126,031 A | 11/1978 | Ignashev et al. |
| 4,250,726 A | 2/1981 | Safian et al. |
| 4,330,699 A | 5/1982 | Farrow |

(Continued)

FOREIGN PATENT DOCUMENTS

| | | |
|---|---|---|
| EP | 0 524 156 A1 | 1/1993 |
| FR | 2 662 180 A1 | 11/1991 |
| JP | 55-4435 A | 1/1980 |

(Continued)

OTHER PUBLICATIONS

U.S. Appl. No. 11/342,846, filed Jan. 31, 2006, Statnikov.

(Continued)

*Primary Examiner*—Mark Budd
(74) *Attorney, Agent, or Firm*—Foley & Lardner LLP

(57) ABSTRACT

Devices including a magnetostrictive transducer, an oscillating system and a tool for ultrasonic impact treatment of constructions, construction units and components of machines and mechanisms are disclosed. The invention provides high reliability of magnetostrictive transducers, oscillating systems and their components, tools and their parts affected by simultaneous action of static, dynamic and impact load on a work surface, high stability of characteristics and interchangeability thereof under conditions of small-scale, full-scale and mass production. The invention also includes design solutions with the use of new methods of the realization and manufacturing technique of the above.

43 Claims, 29 Drawing Sheets

U.S. PATENT DOCUMENTS

| | | | |
|---|---|---|---|
| 4,453,392 | A | 6/1984 | Klubovich et al. |
| 4,624,402 | A | 11/1986 | Pitcairn et al. |
| 4,823,599 | A | 4/1989 | Schneider |
| 4,968,359 | A | 11/1990 | Hebel, Jr. et al. |
| 5,035,142 | A | 7/1991 | Dryga et al. |
| 5,166,885 | A | 11/1992 | Thompson |
| 5,193,375 | A | 3/1993 | Meister |
| 5,242,512 | A | 9/1993 | Bagley et al. |
| 5,286,313 | A | 2/1994 | Schultz et al. |
| 5,330,790 | A | 7/1994 | Calkins |
| 5,352,305 | A | 10/1994 | Hester |
| 5,654,992 | A | 8/1997 | Uraki et al. |
| 5,664,648 | A | 9/1997 | Hester |
| 5,826,453 | A | 10/1998 | Prevey, III |
| 5,841,033 | A | 11/1998 | Burris et al. |
| 5,976,314 | A | 11/1999 | Sans |
| 6,171,415 | B1 | 1/2001 | Statnikov |
| 6,269,669 | B1 | 8/2001 | Matsubara et al. |
| 6,289,705 | B1 | 9/2001 | Duquenne et al. |
| 6,289,736 | B1 | 9/2001 | Statnikov |
| 6,338,765 | B1 | 1/2002 | Statnikov |
| 6,458,225 | B1 | 10/2002 | Statnikov |
| 6,467,321 | B2 | 10/2002 | Prokopenko et al. |
| 6,722,175 | B2 | 4/2004 | Statnikov |
| 6,843,957 | B2 | 1/2005 | Statnikov |
| 6,932,876 | B1 | 8/2005 | Statnikov |
| 7,032,725 | B2 | 4/2006 | Statnikov |
| 2002/0043313 | A1 | 4/2002 | Statnikov |
| 2004/0173290 | A1 | 9/2004 | Statnikov |
| 2004/0244882 | A1 | 12/2004 | Lobanov et al. |
| 2005/0092397 | A1 | 5/2005 | Statnikov |
| 2005/0145306 | A1 | 7/2005 | Statnikov |
| 2005/0242066 | A1 | 11/2005 | Statnikov |
| 2006/0016858 | A1 | 1/2006 | Statnikov et al. |
| 2006/0057836 | A1 | 3/2006 | Nagarajan et al. |
| 2006/0237104 | A1 | 10/2006 | Statnikov |

FOREIGN PATENT DOCUMENTS

| | | |
|---|---|---|
| JP | 2004-122144 A | 4/2004 |
| JP | 2004-122152 A | 4/2004 |
| JP | 2004-149843 A | 5/2004 |
| JP | 2004-167519 A | 6/2004 |
| JP | 2004-169340 A | 6/2004 |
| RU | 2 037 387 C1 | 6/1995 |
| RU | 2 068 741 C1 | 11/1996 |
| RU | 2 106 480 C1 | 3/1998 |
| SU | 563 193 A | 8/1977 |
| SU | 931236 B | 6/1982 |
| SU | 946 841 B | 8/1982 |
| SU | 983 469 A | 12/1982 |
| SU | 1 039 582 A | 9/1983 |
| SU | 1 206 032 A | 1/1986 |
| SU | 1 235 932 A | 6/1986 |
| SU | 1 413 598 A | 7/1988 |
| SU | 1 420 035 A | 8/1988 |
| SU | 1 735 400 A1 | 5/1992 |
| SU | 1 752 448 A1 | 8/1992 |
| SU | 1 772 646 A1 | 10/1992 |
| SU | 1794637 A1 | 2/1993 |
| WO | WO91/17273 A1 | 11/1991 |
| WO | WO93/20247 A1 | 10/1993 |
| WO | WO94/01962 A1 | 1/1994 |
| WO | WO98/43748 A1 | 10/1998 |
| WO | WO98/43749 A1 | 10/1998 |
| WO | WO 2004/013359 A1 | 2/2004 |
| WO | WO 2006/057836 A2 | 6/2006 |

OTHER PUBLICATIONS

U.S. Appl. No. 11/405,523, filed Apr. 18, 2006, Statnikov.

Fisher et al., "Fatigue Strength Improvement of Bridge girders by Ultrasonic Impact Treatment (UIT)," IIW/IIS Document XIII—1916-02, Copenhagen, 2002, 15 pgs.

Fisher et al., "Fatigue strength enhancement by means of weld design change and the application of ultrasonic impact treatment," 14 pgs, 2002.

Galtier et al., "The influence of ultrasonic impact treatment on fatigue behaviour of welded joints in high-strength steel," IIW/IIS Document XIII-1976-03, Bucharest, 2003, 12 pgs.

Guenther et al., "Rehabilitation of Welded Joints by Ultrasonic Impact Treatment (UIT)," IABSE Symposium, Lisbon, 2005, 7 pgs.

Haagensen et al., "Introductory fatigue tests on welded joints in high strength steel and aluminium improved by various methods including ultrasonic impact treatment (UIT)," IIW Doc. XIII-1748-98, Hamburg, 1998, 12 pgs.

Janosch et al., "Improvement of fatigue strength in welded joint (in HSS and aluminium alloy) by ultrasonic hammer peening," IIW Doc. XIII-1594-95, Stockholm, 1995, 21 pgs.

Kudryavtsev et al., "Increasing the fatigue strength of welded joints in cyclic compression," IIW Doc. XIII-1569-94, Beijing, 1994, 6 pgs.

Lihavainen et al., "Fatigue strength of a longitudinal attachment improved by ultrasonic impact treatment," IIW Doc. XIII-1990-03, Bucharest, 2003, 12 pgs.

Roy et al., "Enhancing Fatigue Strength of Welded Joints by Ultrasonic Impact Treatment," (http://www.appliedultrasonics.com/Research.htm), 6 pgs, 1999.

Roy et al., "Enhancing Fatigue Strength by Ultrasonic Impact Treatment," (http://www.appliedultrasonics.com/Research.htm), 35 pgs, 1998.

Statnikov et al., "Efficiency Evaluation of Ultrasonic Impact Treatment (UIT) of Welded Joints in Weldox 420 Steel in accordance with the IIW Program," (http://www.appliedultrasonics.com/Research.htm), 30 pgs, 1998.

Statnikov et al., "Repair Case Study," IIW Doc XIII-WG5-18-98, Hamburg, 1998, 8 pgs.

Statnikov, E.S., "Guide for application of ultrasonic impact treatment for improving fatigue life of welded structures," IIW/IIS—Doc. XIII-1757-99, Lisbon, 1999, 19 pgs.

Statnikov et al., "Comparison of Ultrasonic Impact Treatment (UIT) and other Fatigue Life Improvement Methods," IIW/IIS—Document XIII-1817-00, Florence, 2000, 27 pgs.

Statnikov, E.S., "Repair of Fatigue Loaded Weld Structures," IIW Doc. No. XIII-WG-1873-01, Slovenia, 2001, 6 pgs.

Statnikov et al., "Comparison and the Improvement in corrosion Fatigue Strength of Weld Repaired Marine Cu 3-grade Bronze Propellers by Ultrasonic Impact Treatment (UIT) or Heat Treatment," IIW/IIS—Doc. XIII-1964-03, Bucharest 2003, 34 pgs.

Statnikov et al., "Specification for weld toe improvement by ultrasonic impact treatment," IIW Doc. XIII-1617-96, Budapest, 1996, 10 pgs.

Statnikov et al., "Ultrasonic impact treatment (UIT) of welded joints (Summary of the method)," Budapest, 1996, 3 pgs.

Statnikov, E.Sh., "Applications of operational ultrasonic impact treatment (UIT) technologies in production of welded joints," IIW/IIS—Doc XIII-1667-97, 17 pgs, 1997.

Statnikov, E.Sh., "Comparison of post-weld deformation methods for increase in fatigue strength of welded joints," IIW/IIS—Doc. XIII-1668-97, San Francisco, 1997, 7 pgs.

Statnikov, E.S., "Guide for application of ultrasonic impact treatment improving fatigue life of welded structures," IIW/IIS—Doc. XIII-1757-99, Lisbon, 1999, 17 pgs.

Statnikov, E., "Physics and mechanism of ultrasonic impact treatment," IIW Doc. XIII-2004-04, 30 pgs, 1999.

Trufyakov et al., "Ultrasonic Impact Treatment of Welded Joints," IIW Doc. XIII-1609-95, 10 pgs. 1995.

Trufiakov et al., "The Efficiency of Ultrasonic Impact Treatment for Improving the Fatigue Strength of Welded Joints," IIW Doc. XIII-1745-98, Hamburg, 1998, 12 pgs.

Wright, W., "Post-weld treatment of a welded bridge girder by ultrasonic impact treatment," Sep. 29, 1996, 6 pgs.

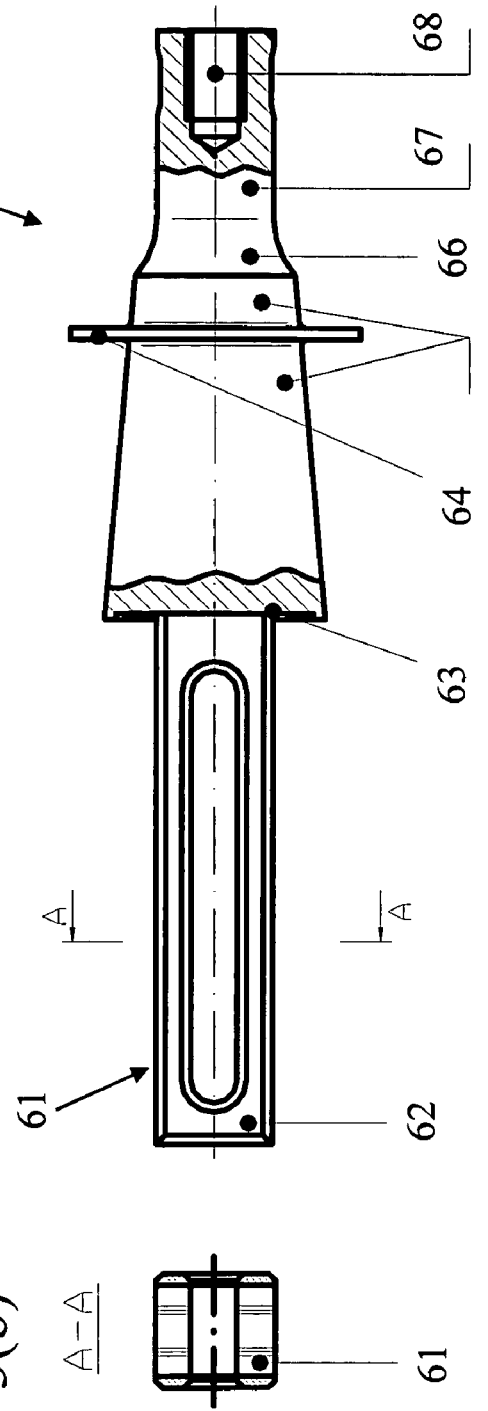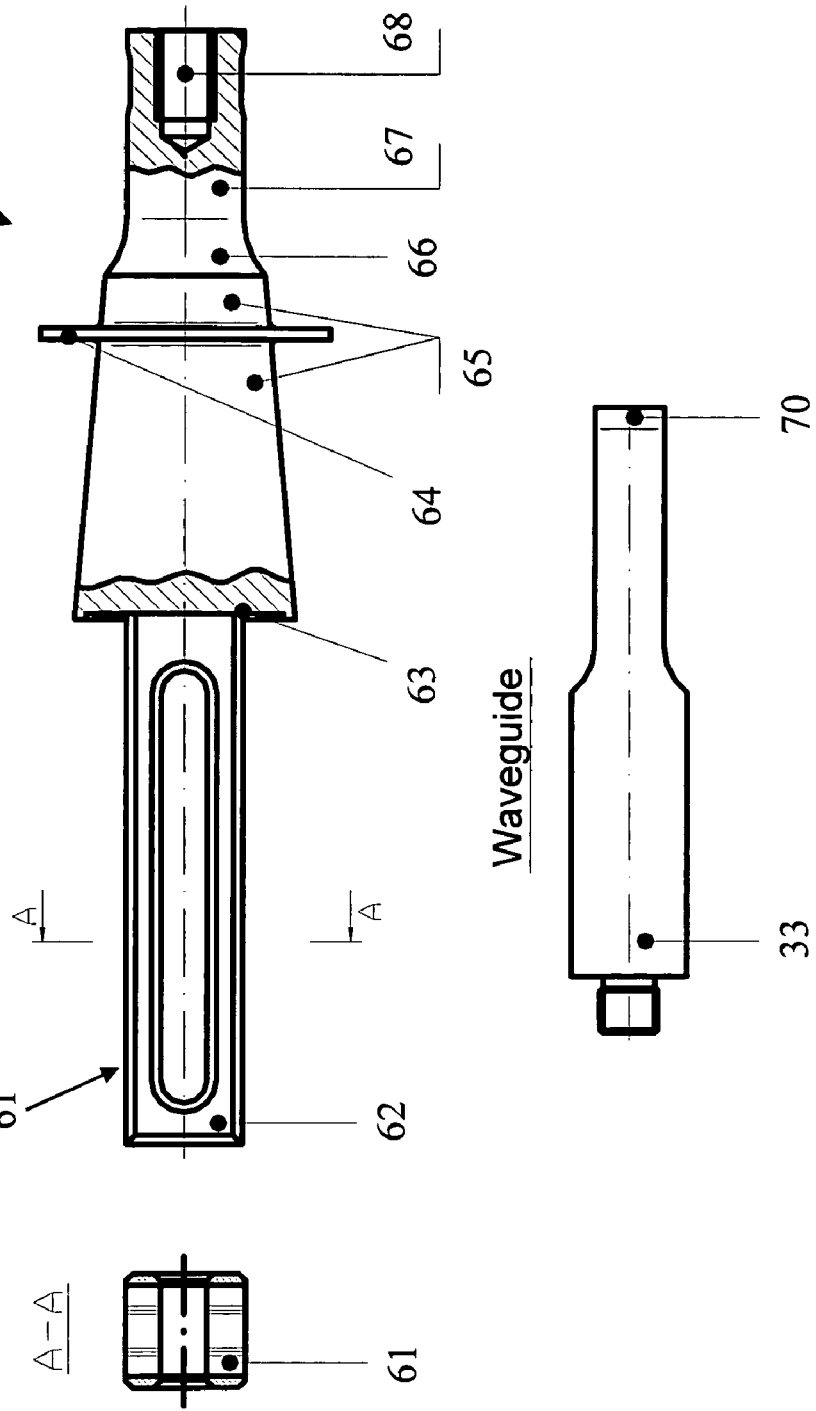

Treatment time is equal in all variations

Scope 1 – piezoelectric lamination under the treated surface.
Scope 2 – contact sensor.

| Pin indenter length absolute value / relative to a wavelength | Total plastic deformation, conventional units | Treatment efficiency depending on a pin length | Required time for 1,000,000 conventional units of plastic deformation, ms |
|---|---|---|---|
| 6 mm / 1/32λ | 2731200 | 3.01 | 66.4 |
| 12 mm / 1/16λ | 2615100 | 3.08 | 64.9 |
| 25 mm / 1/8λ | 4234700 | 5.10 | 39.2 |
| 33 mm / 1/6λ | 2535900 | 2.84 | 70.3 |
| 49 mm / 1/4λ | 2027500 | 2.26 | 88.3 |

FIGURE 7(f)

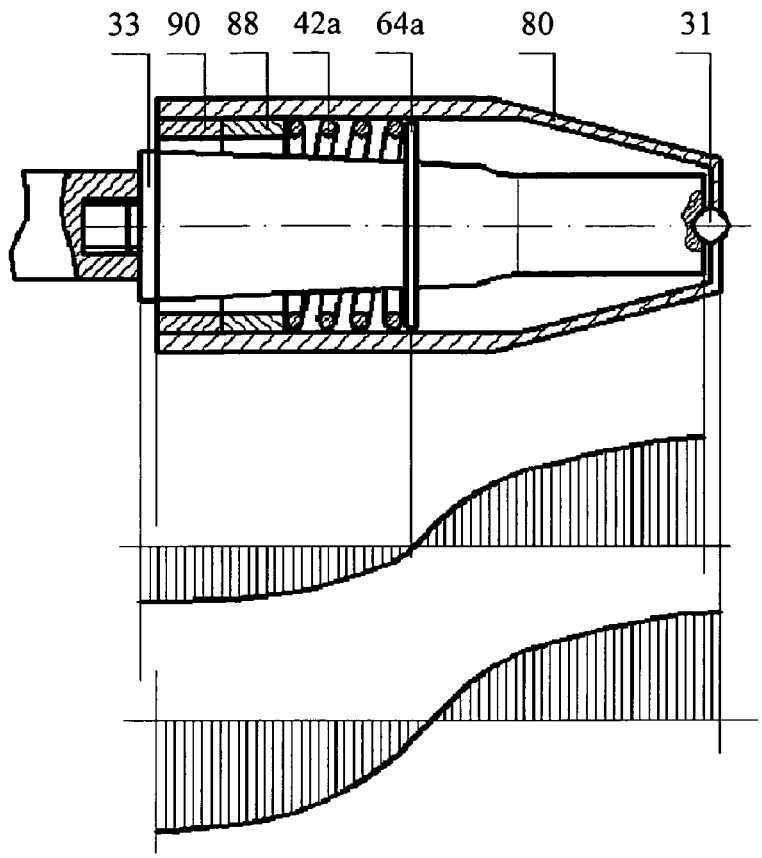
FIGURE 8(a)
FIGURE 8(b)
FIGURE 8(c)
FIGURE 8(d)
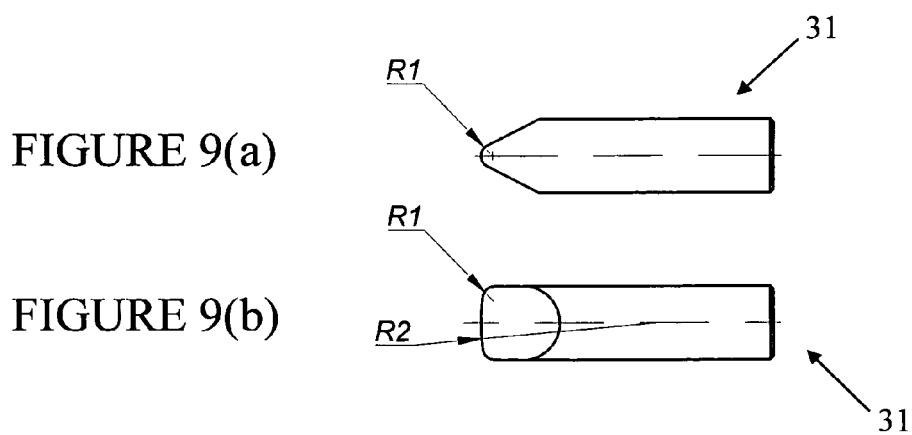
FIGURE 9(a)
FIGURE 9(b)

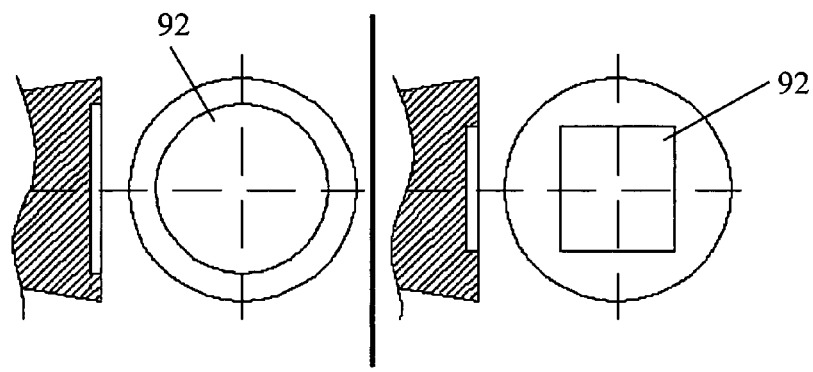
FIGURE 11 (a)   FIGURE 11(b)
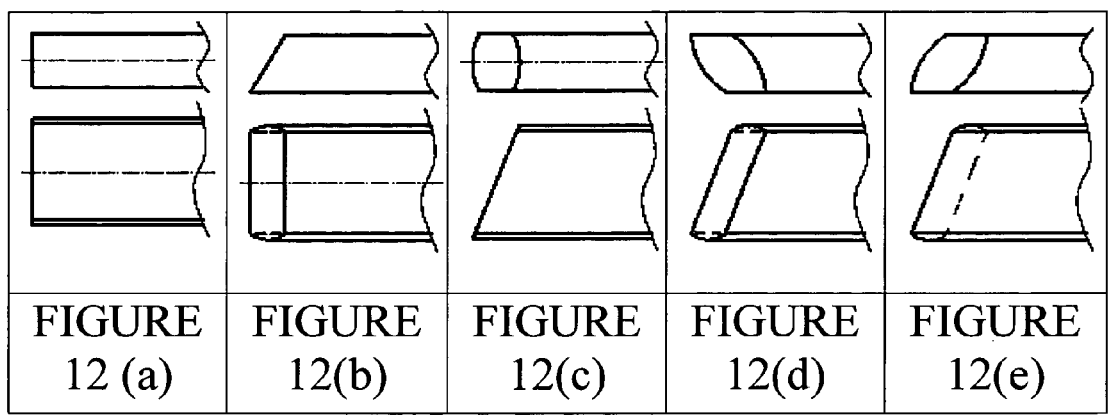
| FIGURE 12 (a) | FIGURE 12(b) | FIGURE 12(c) | FIGURE 12(d) | FIGURE 12(e) |
FIGURES 12(a) – (e)

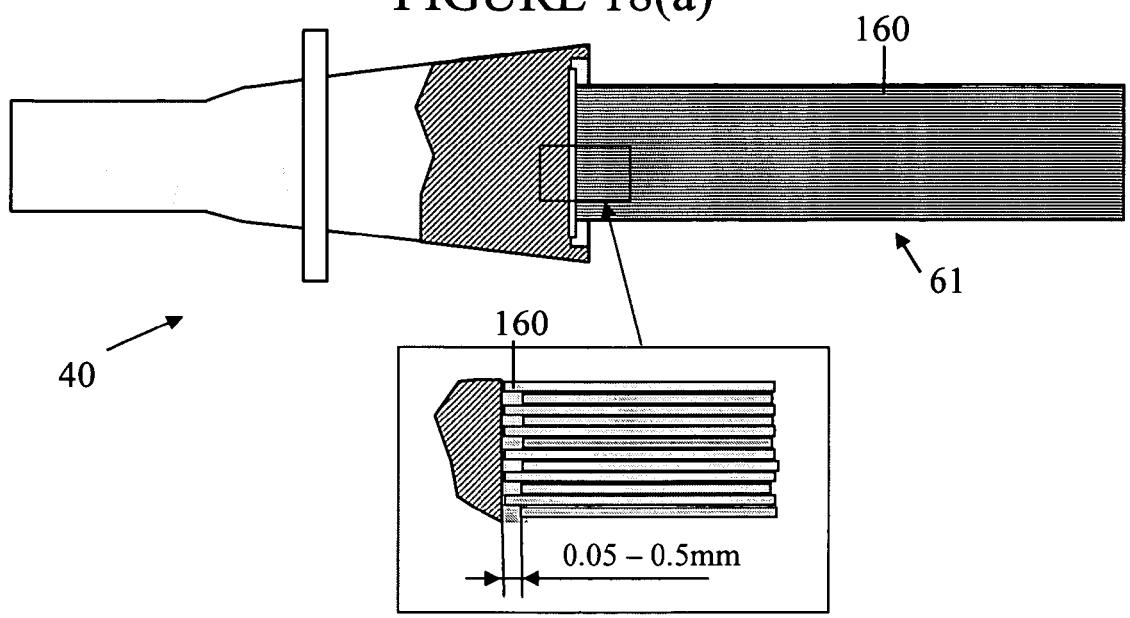
FIGURE 18(a)
FIGURE 18(b)
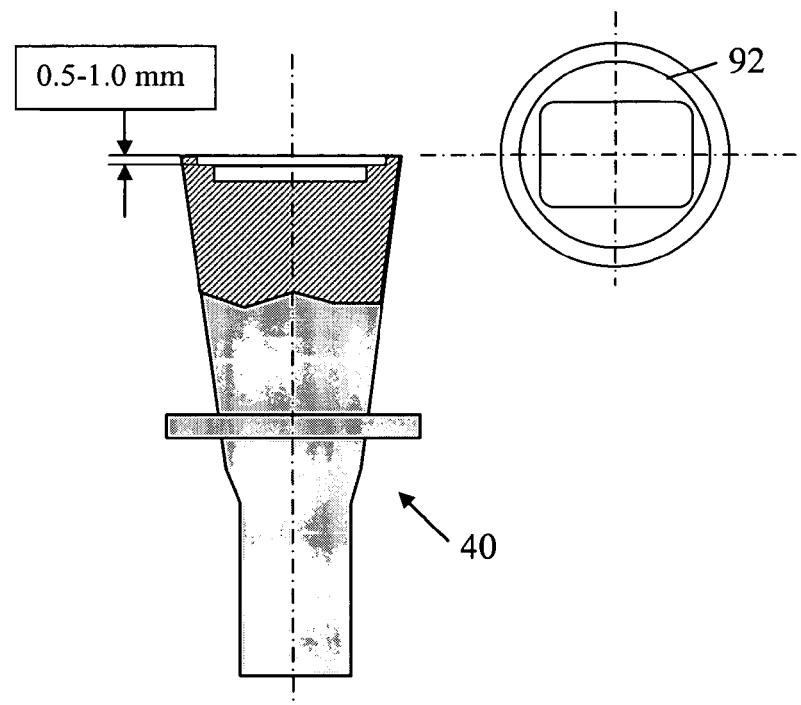
FIGURE 19(a)  FIGURE 19(b)

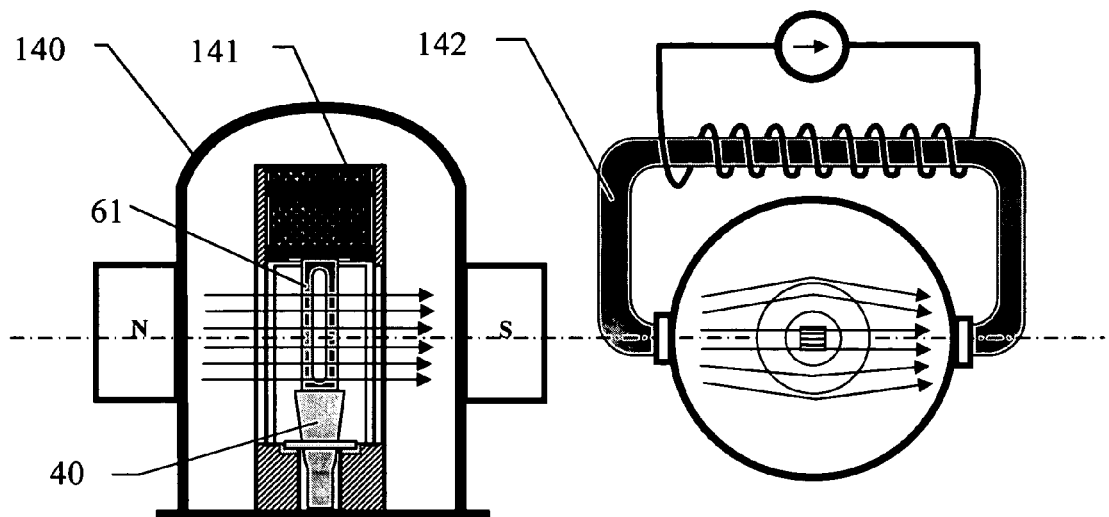
FIGURE 20
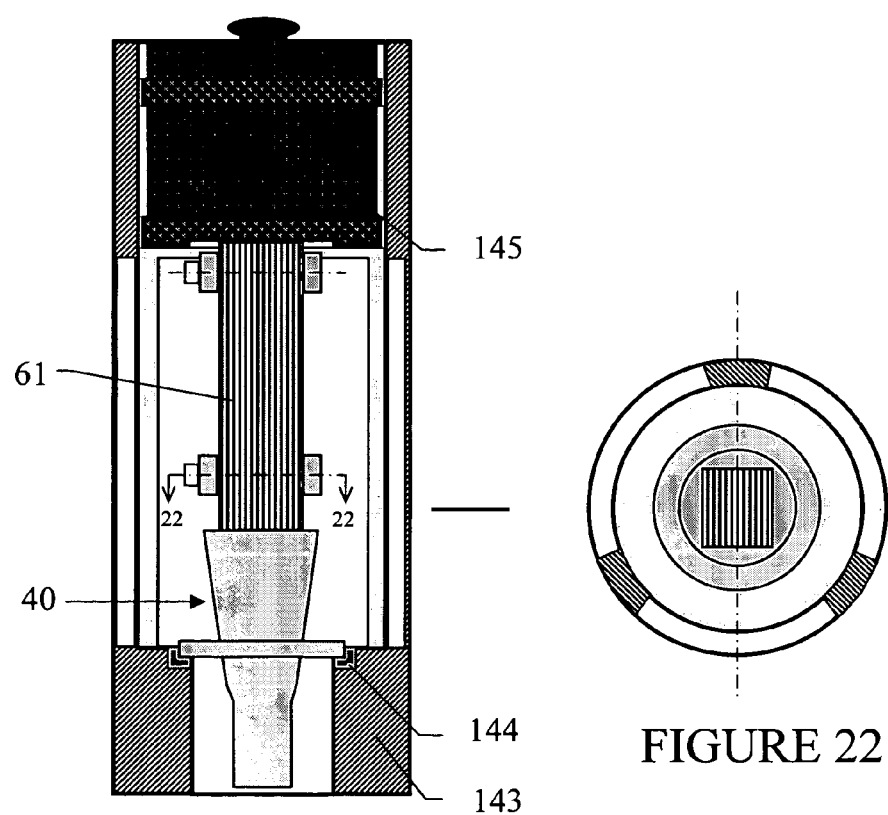
FIGURE 21
FIGURE 22

◄──► Working travel of tool

→ Adjustment travel of the tool
◄--► Working travel of the tool
← Pressure of the tool

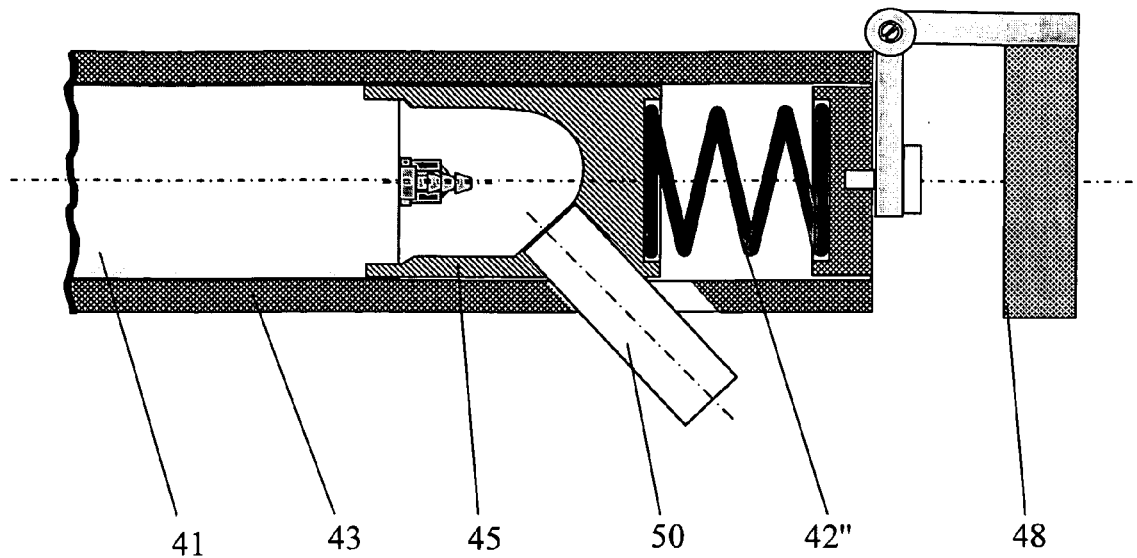
FIGURE 29
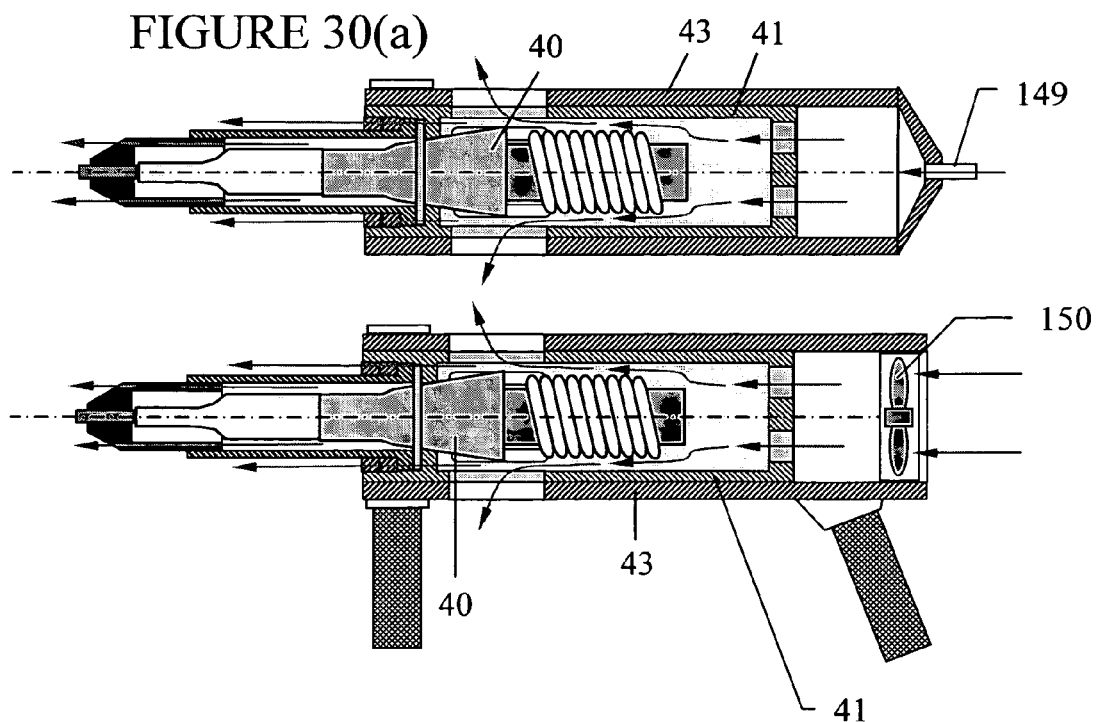
FIGURE 30(a)
FIGURE 30(b)

FIGURE 33
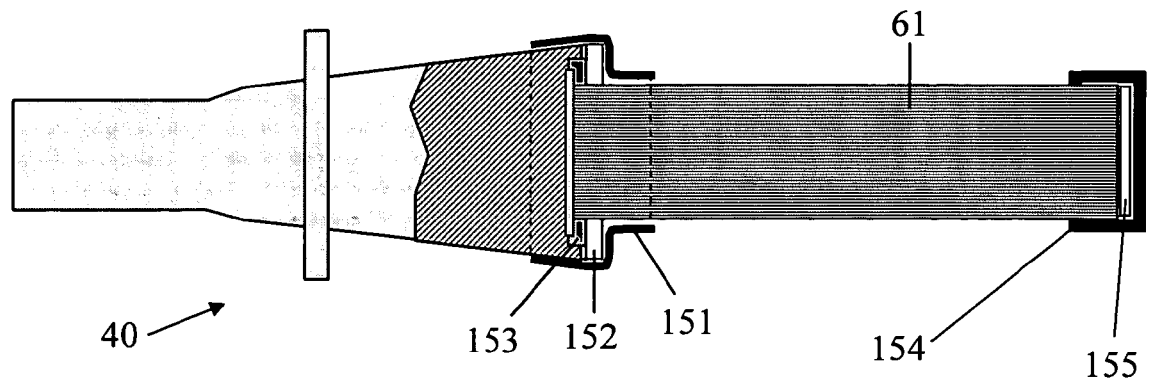
FIGURE 34(a)
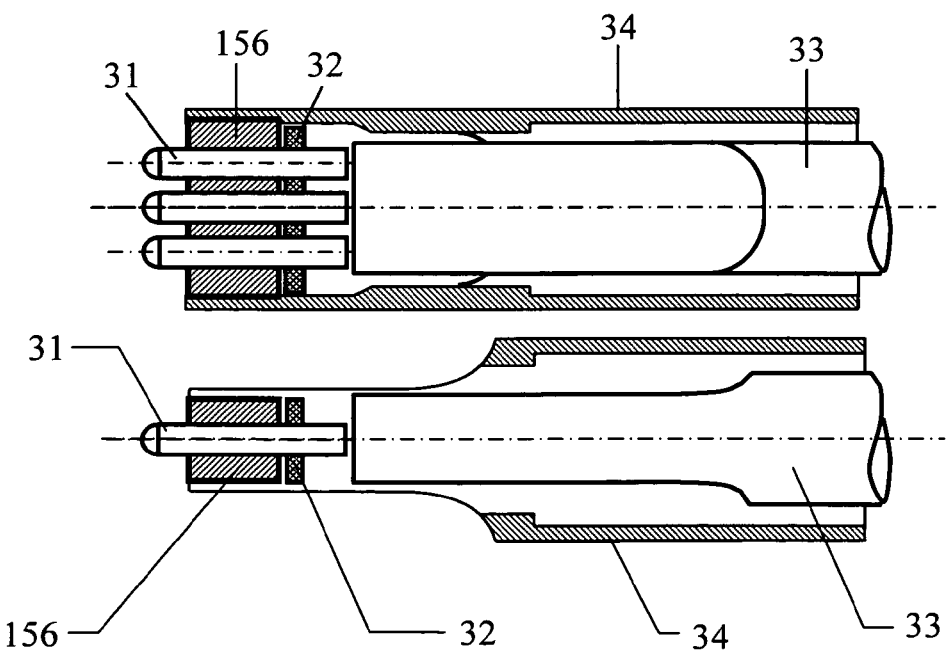
FIGURE 34(b)

OSCILLATING SYSTEM AND TOOL FOR ULTRASONIC IMPACT TREATMENT

RELATED APPLICATION

This application is a continuation-in-part of U.S. Ser. No. 11/206,906 filed Aug. 19, 2005 entitled "OSCILLATING SYSTEM AND TOOL FOR ULTRASONIC IMPACT TREATMENT."

FIELD OF INVENTION

The present invention relates to tools, devices and methods for ultrasonic impact treatment (UIT) of metals and alloys in order to strengthen the metals and alloys and remove strains therefrom. The tools and devices comprise an oscillating system with a magnetostrictive transducer and an impact indenter for treatment of constructions, construction units and components of machines and mechanisms. The present invention provides high reliability of magnetostrictive transducers, oscillating systems and their components, affected by simultaneous action of static, dynamic and/or impact load on a work surface, high stability of characteristics and interchangeability thereof under conditions of small-scale, full-scale and mass production.

BACKGROUND OF THE INVENTION

The first tools for ultrasonic impact treatment based on magnetostrictive transducers were described in USSR Inventor's Certificate No. 472782 of Jul. 4, 1972. Practically, this tool has not been changed for more than 30 years. Today, the requirements for stability, technological effectiveness and reliability of ultrasonic tools have significantly increased due to, among other things, the appearance of new metals and alloys.

The basic hand tool for ultrasonic impact treatment has the following basic components: a magnetostrictive transducer with a concentrator of oscillating velocity, waveguides and indenters, which when combined comprise an oscillating system (OS); a transducer case with pumpable cooling liquid (water, cooling agent); lock nuts, a pin holder, a spring coupling and a body with a handle. Both magnetostrictive and piezoceramic ultrasonic transducers have been well-known for more than 50 years. For a number of years, the shape of both types of transducers has not been considerably changed. Conventionally, the transducer is a rod or rods made of piezo-active material with clamp plates reducing frequency, or resonance waveguides, such as transformers of oscillating velocity. Presently in the market of strengthening ultrasonic technologies, powerful tools have a short time to failure during treatment of such materials as cast iron, stainless steel, high-tensile steels and alloys of aluminum, titanium, copper, etc.

Magnetostrictive transducers are used under impulse impact load during ultrasonic impact treatment. During this process, the active components of the transducers are subjected to limiting mechanical stresses for the material from which they are made. The known manufacturing techniques of magnetostrictive transducers do not allow consistency of amplitude-frequency and energy characteristics of oscillating systems. The main oscillating system manufacturing steps are core manufacture and assemblage, concentrator manufacture, core annealing, brazing, and impregnation.

Today in the world, the manufacture of powerful specific-purpose magnetostrictive transducers is custom-made and small-scale. Transducer manufacturing technique results in scatter up to 30% of the parameters of oscillating systems based on those transducers. This makes it impossible to use such transducers under continuous manufacturing conditions where the main performance criterion for equipment is stability and repeatability of characteristics, oscillating system reliability and an agreement thereof with current standards and hence the interchangeability thereof.

Piezoceramic transducers have a wide distribution in treatment under constant load in such procedures as ultrasonic cleaning, impregnation, etc., which are carried out in liquid environments as a rule. Piezoceramics are known not to stand a great impact effect. Today, attempts are made to use piezoceramics for ultrasonic impact treatment at low power up to 500 Watts (W) with a static tool pressure up to 50 N, such as disclosed in U.S. Pat. No. 6,467,321. However, these tools can be used only for specified purposes for treating materials with low strength and consequently, the tools do not have an extensive use for work hardening. Oscillating systems based on piezoceramics cannot ensure sufficiently high power level and a resistance to impact and dynamic loads required for treatment of most known structural materials.

OBJECTS AND SUMMARY OF THE INVENTION

The present invention relates to tools, devices and methods for ultrasonic impact treatment (UIT) of metals and alloys in order to strengthen the metals and alloys and remove strains therefrom. The tools and devices comprise a magnetostrictive transducer of the ultrasonic oscillating system. A tool is designed for ultrasonic impact treatment of constructions, construction units and components of machines and mechanisms. The present invention provides high reliability of magnetostrictive transducers, oscillating systems and their components, tools and parts affected by simultaneous action of static, dynamic and impact load on a work surface, high stability of characteristics and interchangeability thereof under conditions of small-scale, full-scale and mass production.

UIT tool manufacturing with the use of magnetostrictive transducers sets new tasks connected with the extension of the tool application area in up-to-date industry and production. These tasks include:

Efficiency of magnetostrictive transducers according to the criteria of maximal use of transducer power and minimization of transducer weight and dimensions;

Oscillating system stability to specified oscillation mode under impact conditions when the tool is subjected to great dynamic and static forces;

Ensuring reliable damp-proof seal along the zero collar considering vibro-impact loads and motion pertaining to Poisson caused by ultrasonic oscillations during tool operation;

Ensuring controlled acoustic coupling between the indenter and the waveguide;

Increasing the life of the guide holes of the pin holder during long tool operation;

Increasing the life of a technical waveguide tip under long loading;

Using the energy reserve of the elastic energy stored during tool rebound; and

Tool universality and ergonomicity under different conditions.

The present invention also relates to engineering solutions for producing new UIT tools which can stand specified acoustic and mechanical loads under various working conditions, as well as during long operation under continuous-running manufacturing conditions.

BRIEF DESCRIPTION OF THE DRAWINGS

Referring to the drawings:

FIG. 3(a) shows a side view of a conical-cylindrical transducer;

FIG. 3(b) shows a cross-sectional view of the magnetostrictive core of FIG. 3(a) along the line A-A;

FIG. 3(c) shows a side view of a technical waveguide of the present invention;

FIGS. 7(a)-7(f) show results of a comparison of pin indenters having different lengths;

FIGS. 8(a)-8(d) show an indenter press system during ultrasonic impact treatment;

FIGS. 9(a)-9(b) show side and front views, respectively, of a two-radii indenter;

FIGS. 11(a)-11(b) illustrate two shapes of recess holes for a core on a concentrator;

FIGS. 12(a)-12(e) illustrate waveguide working tip configurations;

FIGS. 18(a) and 18(b) show a partial cut-away view of a transducer with regularly displaced plates of the magnetostrictive core in the brazing area;

FIGS. 19(a) and 19(b) show a partial cut-away view of a concentrator of oscillating velocity of a magnetostrictive transducer, wherein the concentrator has a round recess in the brazing area;

FIG. 20 shows a schematic representation of a brazing process of the magnetostrictive transducer in a magnetic field;

FIG. 21 shows an assembly jig for magnetostrictive transducer assembly and brazing;

FIG. 22 shows a top cross-section view of a magnetostrictive core of FIG. 21 along the line 22-22;

FIG. 29 shows an embodiment of a tool rear portion with a quick-change spring that axially connects a transducer case with a tool body;

FIGS. 30(a) and 30(b) show embodiments of an ultrasonic impact tool with air cooling of the magnetostrictive transducer;

FIG. 33 shows a detail of a magnetostrictive transducer core end with a cavitation erosion protection means;

FIG. 34(a) shows a top view of a pin holder with a replaceable insert; and

FIG. 34(b) shows a side view of a pin holder with a replaceable insert.

DETAILED DESCRIPTION OF THE PREFERRED EMBODIMENTS

Figure 1:
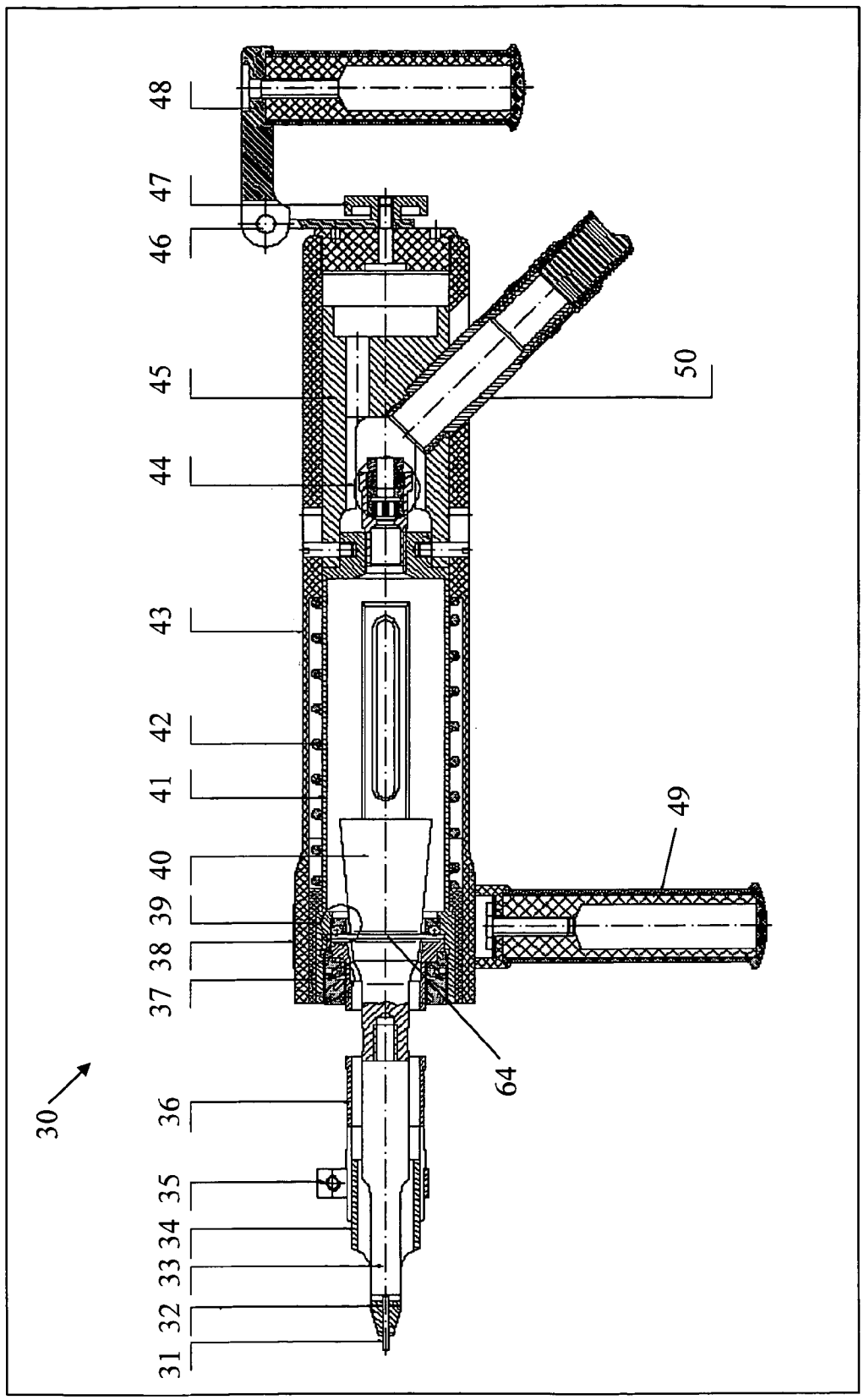
FIG. 1 shows a side view of a tool assembly of the present invention.

The present invention relates to tools, devices and methods for ultrasonic impact treatment of metals and alloys in order to strengthen the metals and alloys and remove strains therefrom. FIG. 1 shows a tool assembly of the present invention. The basic tool 30 comprises at least one indenter 31, a thermoelastic retainer plate 32, a technical waveguide 33, a pin holder 34 with a clamp 35, a pin holder bracket 36, thread rings 37, a side handle clamp 38, a sealing assembly 39 over the zero collar 64, a magnetostrictive transducer 40 with a transducer cooling case 41, a spring 42, a tool body 43, a wire sealing assembly 44, a bushing 45, nuts or clamp screws 46,47, a front handle 48, a side handle 49 and an output assembly 50 for hoses and cables.

In FIG. 1, the output assembly 50 shows the hoses with cooling liquid and the power cable of the transducer 40. The output assembly 50 is mounted on the bushing 45, centered relative to an internal diameter of the tool body 43. The hollow bushing 45 may preferably be rigidly fixed by a clamp screw to the transducer case 41 and moves freely along the tool 30 together with the transducer case 41. Thus, during ultrasonic impact treatment, the bushing 45 moves longitudinally inside the tool body 43 synchronously with the transducer case 41. The output assembly 50 is twisted in the bushing 45 at an angle which is preferably ergonomic for an operator of the tool 30. The inside face of the bushing 45 smoothly enters into the inside face of the output assembly 50. Therefore, the cable and hoses in the output assembly 50 are not subjected to any mechanical effect from the tool body 43.

The wire output sealing assembly 44 of the magnetostrictive transducer 40 preferably comprises an elastic retainer with holes for wires, wherein the bushing is a split hollow cone. The split hollow cone bushing and a thread ring move freely along a thread having a bore cone-shaped hole. The thread ring presses the elastic retainer under an action of radial forces when tightening by stationary relative to the axis of the cone-shaped bushing.

In an embodiment, the transducer case 41, which, among other things, is used as a basic element in the cooling system of the transducer 40, may also act as a tool body. In this case, the transducer case 41 is preferably centered relative to the tool body 43. The tool body 43 and the transducer case 41 are connected by a spring 42 to provide vibro-acoustic decoupling during tool operation. The structural dimensions of the spring are preferably pre-selected according to a required spring rate which is sufficient to control the impact efficiency and parameters with multiplicity of frequency and energy balance between natural oscillations of the tool and oscillations of the treated material initiated by ultrasonic impacts on the treated material produced by an oscillating system as a part of the tool 30.

The parameters of the spring 42 are preferably defined under the condition of natural oscillation energy balance in the system of coupled circuits: "springs with added toll mass" and "equivalent elasticity of an indenter with equivalent mass of a workpiece reduced to the point of impact." As a result of such approach to the selection of the spring parameters, an impact frequency of suspended (or pressed) toll mass on the spring 42 coincides with a frequency of the natural oscillations of the workpiece under the action of the impacts. Thus, the maximal use of elastic energy stored in the system of coupled circuits is provided, resulting in higher efficiency of impacts, and accompanying positive effects thereof, such as an increase in microhardness, a reduction in workpiece surface roughness and an increase in a depth and level of induced residual compressive stresses.

The front handle 48 of the tool 30 is preferably fixed to the tool body 43 by the clamp screws 46,47. The front handle 48 preferably has at least three degrees of freedom and may be installed in front and side positions. An operator performing ultrasonic impact treatment may install the front handle 48 in any suitable position. This is important to provide high quality treatment and specifically with the use of pin holders 34 having one, two or more indenters 31 positioned in parallel, coaxially or at an angle to the tool axis, in particular, abreast when it is necessary during operation to position the tool 30 in space.

The side handle 49 preferably has about two degrees of freedom and is preferably mounted on the cylindrical tool body 43 by the side handle clamp 38. The side handle 49 enables the tool 30 to be stably held by an operator at a required angle to the treated surface.

The tool assembly 30 is described in greater detail hereafter.

Figure 2A:
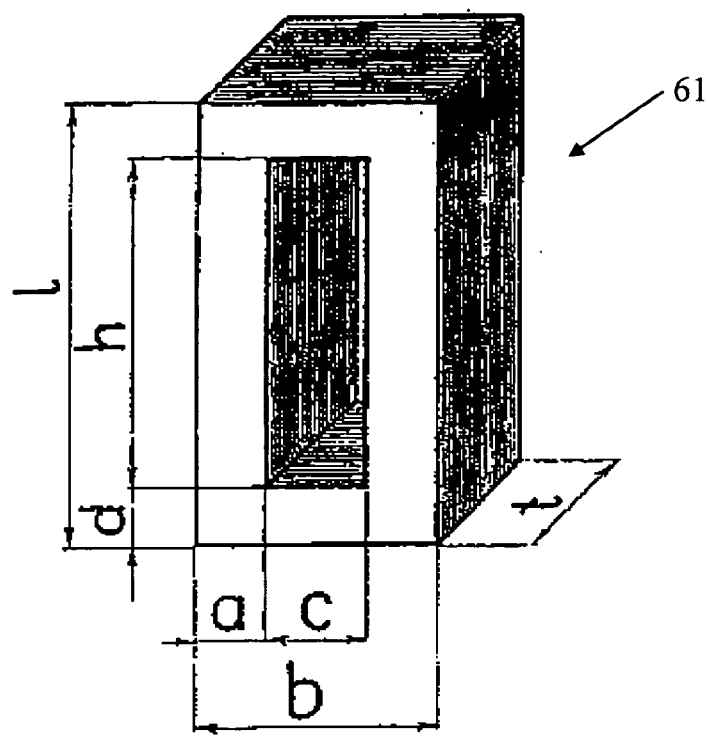
FIG. 2(a) shows an O-shaped magnetostrictive core having optimized dimensions of the present invention.
Figure 2B:
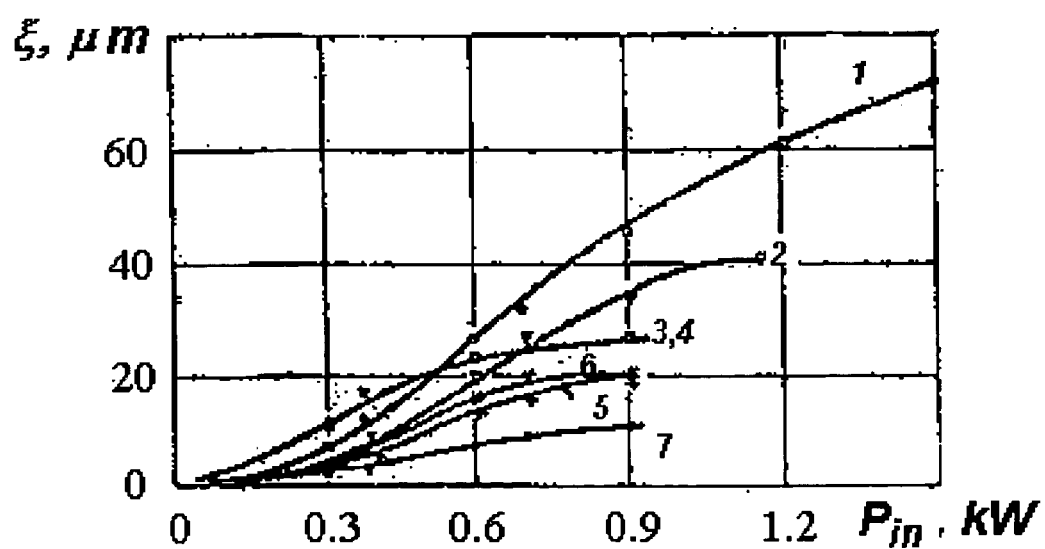
FIG. 2(b) shows a chart of magnetostrictive saturation curves for different dimension types of cores of the same frequency.

The magnetostrictive transducer 40 of the present invention has a magnetostrictive core 61 which is preferably O-shaped. An O-shaped magnetostrictive core 61 having optimized dimensions is shown in FIG. 2(*a*). The optimization technique is based on selecting a certain relationship between the transversal and longitudinal dimensions of a core, at which the maximum excitation efficiency is obtained. This lies in changing core longitudinal and transversal dimensions simultaneously (during selection, in particular by means of experiment) at a given and constant, during selection, operating resonance frequency and a constant cross-section area of a core. Amplitude dependencies on electric power at transducer input for several cores having equal resonance frequency are shown in FIG. 2(*b*). The O-shaped magnetostrictive core 61 of the invention preferably has the proportion of dimensions as follows:

$$\frac{b}{l}=\frac{2}{9};\frac{c}{h}=\frac{2}{19};\frac{c}{b}=\frac{2}{5}.$$

The O-shaped magnetostrictive core 61 has a maximal limiting amplitude for core material and a minimal relationship between mass and oscillation displacement amplitude or mass and acoustic power at the output of the oscillating system. A maximal limiting amplitude of ultrasonic displacements of the O-shaped magnetostrictive core at a fatigue limit of the core material based upon $2\times10^7$ and greater cycles is achieved by optimizing and determining a relationship between the longitudinal and transversal dimensions of core laminations in a range of values equal to about the ratios between: lamination width and height being about ⅖, right-angled hole width and height thereof being about 2/19 and right-angled hole width and lamination width being about ⅖. These relationships stay constant in all ranges of technical frequencies. The permissible scatter of dimensions is preferably about 5%.

The magnetostrictive core is centered relative to the transducer axis when it is mounted at an end of the concentrator of oscillating velocity within a round recess of a diameter equal to a core tip diagonal, wherein the round recess is coaxial and perpendicular to the concentrator axis. Alternatively, the magnetostrictive core is centered by means of mounting the core in a rectangular socket with a shape to accommodate the core tip. The depth of the recess or slot should be 0.1 mm and less of a core web height.

Referring to FIGS. 3(*a*)-3(*c*), the transducer 40 comprises a concentrator, which serves as a transformer of oscillating velocity and has a specified shape in the form of a body of revolution. The surface thereof comprises a conical portion 65 with a zero collar 64, a flute transition radius 66 and a cylindrical portion 67. The conical portion 65 is preferably a low-amplitude part and the cylindrical portion 67 is preferably a high-amplitude part. The length of the cylindrical portion 67 is from about ⅛ up to ⅕ from the resonance frequency wavelength of the transducer 40. The center of the flute transition radius 66 is in a secant plane of coupling between the cylindrical portion 67 and the flute transition radius 66. The coupling radius is from about ½ up to ⅓ from the cylindrical portion 67 length. A recess hole 63 on the concentrator backside, which is coaxial and perpendicular to the concentrator axis, is made for magnetostrictive core installation. A brazed core-concentrator joint is preferably made thereat. A hole 68 on the working tip is preferably made for quick replacement of technical waveguides 33 of different configurations. In a preferred embodiment, the pin holder 34 (not shown) is preferably fixed by means of the clamp 35 directly in the bracket 36 which is connected to the transducer 40 via a zero collar of the transformer of oscillating velocity (concentrator). The high-amplitude cylindrical portion 67 has flats to fix the transducer 40 with wrenches when mounting a technical waveguide 33. High amplitudes of mechanical displacements during treatment of high-tensile steels and alloys require strengthening of the working tips 70 of the waveguides 33.

The magnetostrictive core 61 has laminations about 0.2-0.25 mm in thickness, and clamp plates 62 with chamfers preferably made of titanium alloy with a thickness preferably of about 2 mm. The laminations are preferably made of magnetically soft magnetostrictive Fe—Co alloy that preferably contains 49% of iron, 49% of cobalt and 2% of vanadium, and supplied in the form of a band or plates of a required thickness. The laminations are cut out so that the longer side is along a rolling direction. The magnetostrictive core 61 transforms electromagnetic oscillations in the core winding into mechanical oscillations along the core 61. The clamp plates 62 are used when assembling a magnetostrictive transducer 40 and to prevent failure of the sealing of the winding wire in service.

A reliable fixation of the magnetostrictive transducer 40 in the transducer case 41 under an action of impacts is ensured by a thread ring having seven or more threads with a radial slot of a width of one thread pitch or greater at a distance equal to 1 to 2 thread pitches from a tip of the thread ring and an internal conical groove on a tip on a side of the radial slot. Fixation is provided by means of resting against the thread ring on a side of the groove, thereby producing additional elasticity when locking occurs by a locking nut with seven or more threads.

Figure 4A:
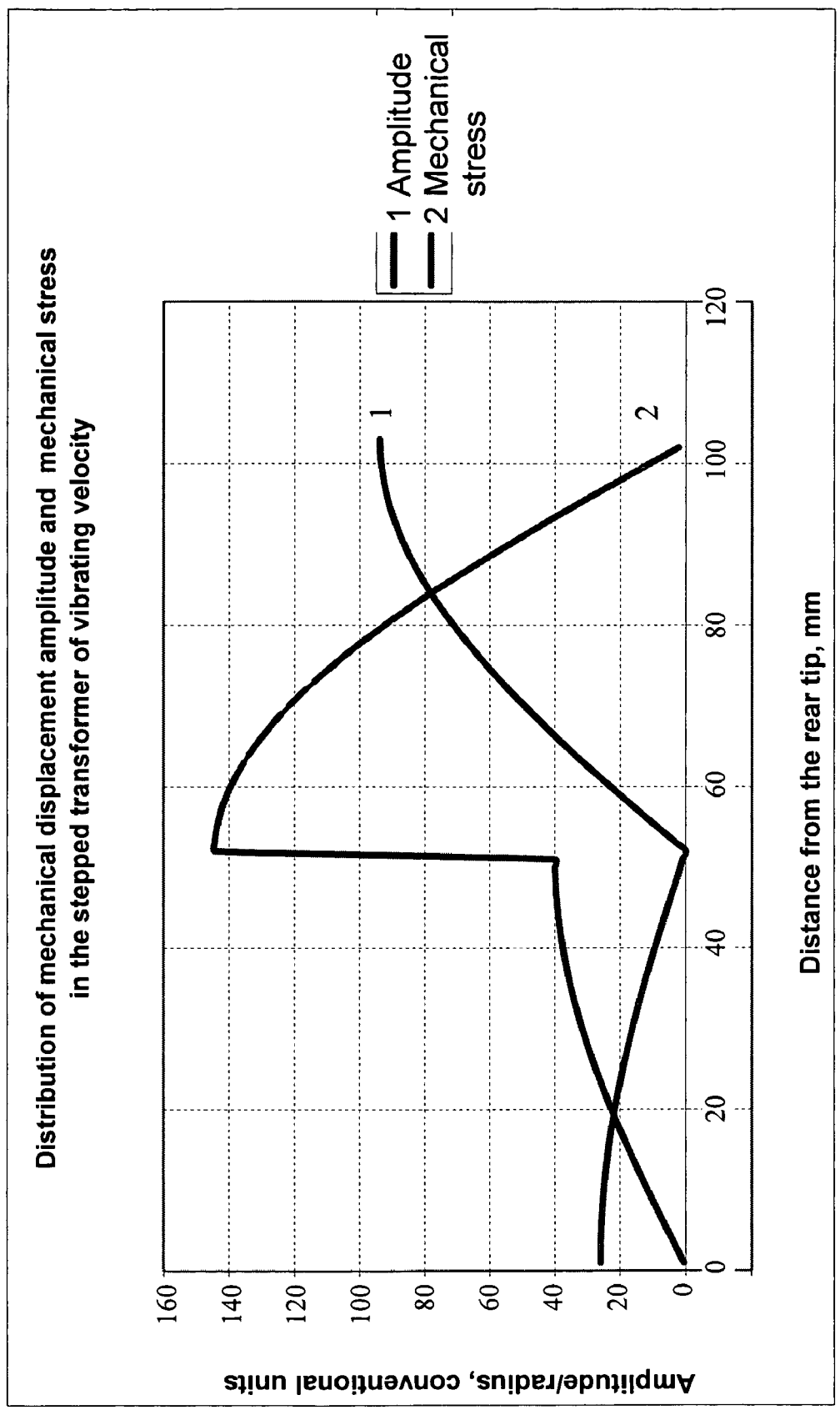
FIGS. 4(a)-4(c) show comparison curves of transformers of oscillating velocity having different configurations when equal input displacement amplitudes are 26 μm.
Figure 4B:
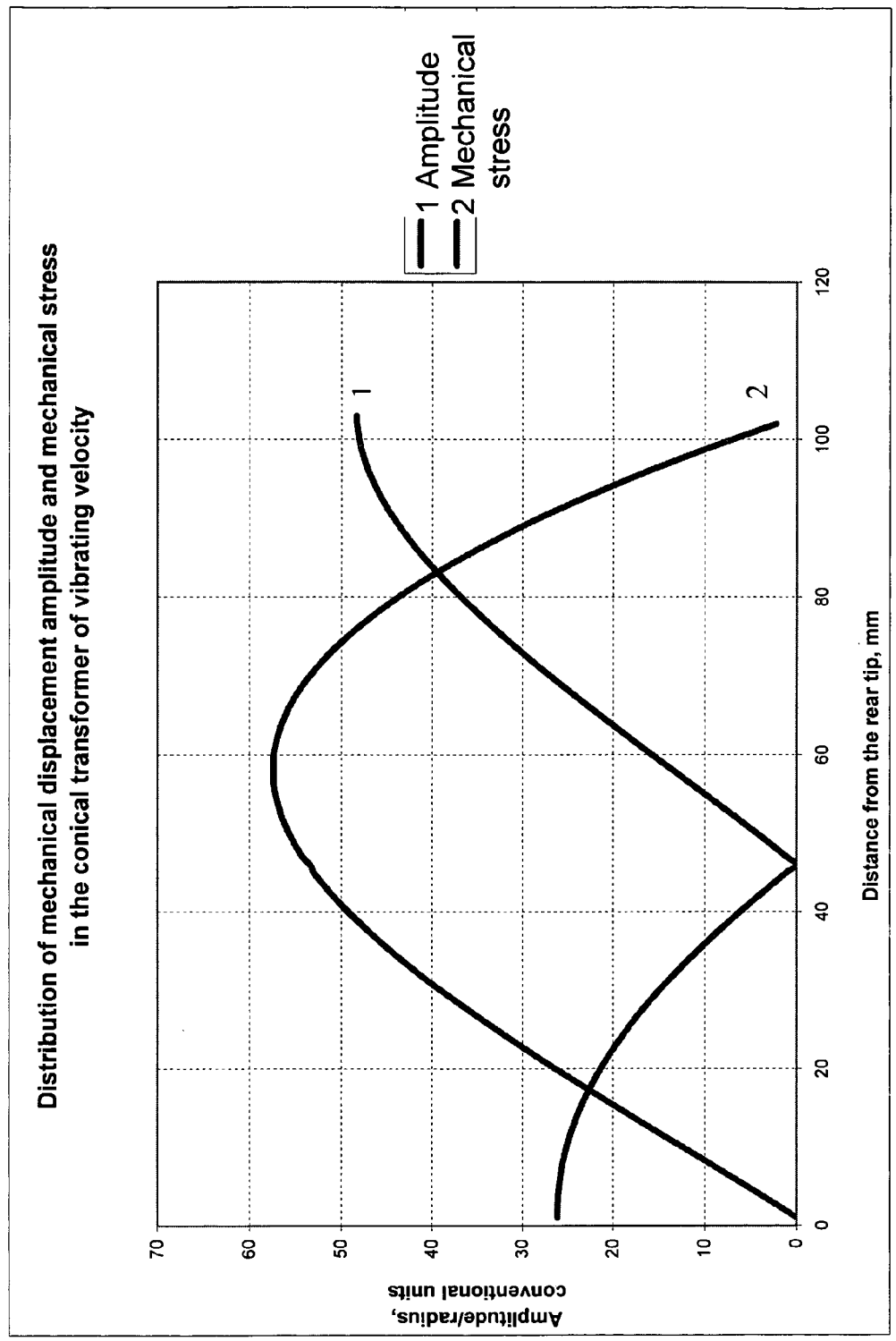
Figure 4C:
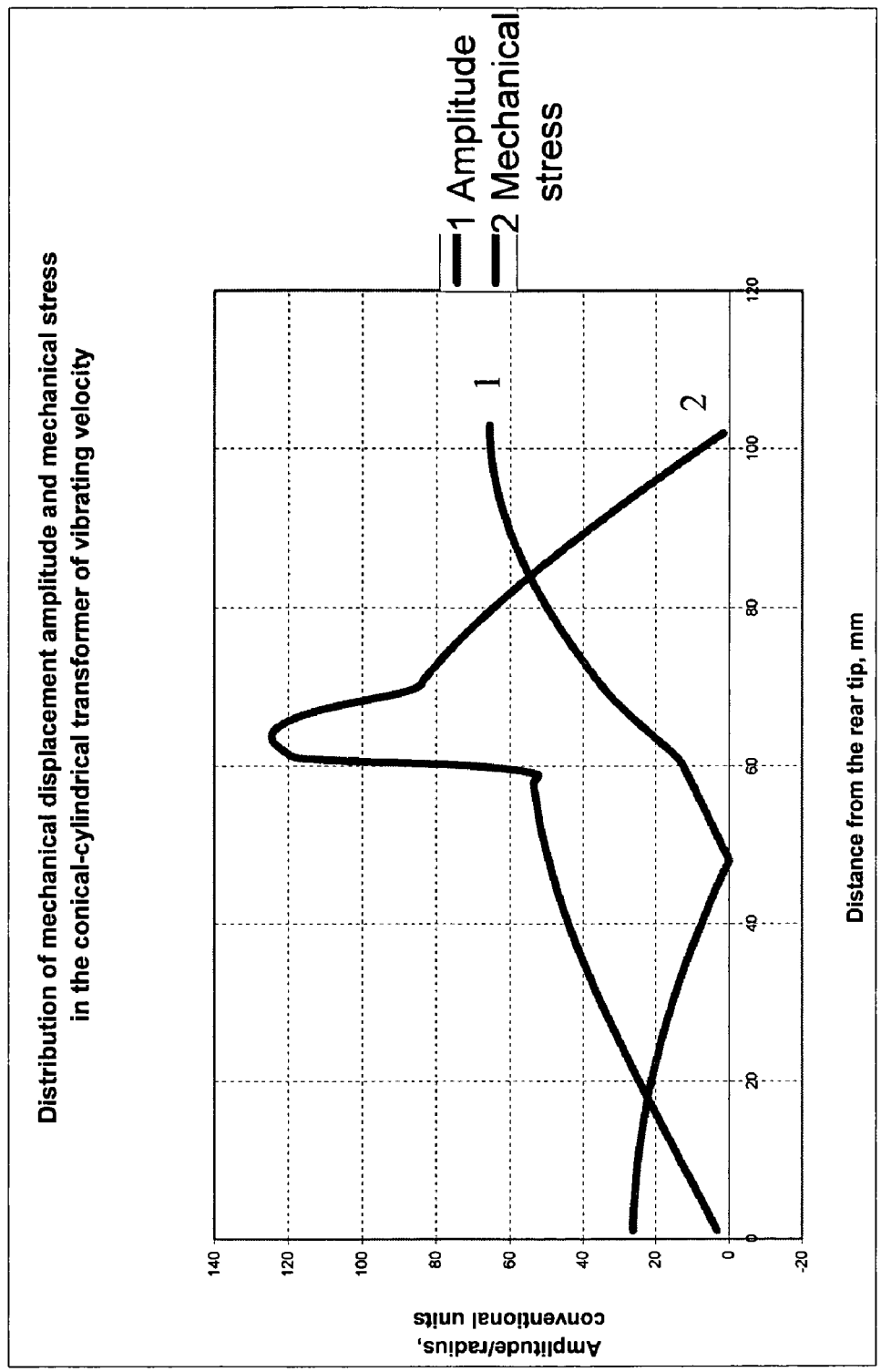

In the magnetostrictive transducer 40 of the present invention, the "reproducibility" requirement applies to the transducer characteristics on the one hand and the characteristics of the treated surface material on the other. The transducer characteristics which are to be reproducible include: resonance frequency, Q-factor, oscillating amplitude at a resonant frequency, the above characteristics under no-load and loaded conditions, as well as oscillating velocity transformation coefficient and stability of the above characteristics of the oscillating system under variable loading. The characteristics of the treated surface material which are to be reproducible include: residual stresses, microhardness, the nature and depth of distribution thereof, surface roughness, impact strength, abrasive wear resistance and other physical-mechanical properties of the material in the area treated by UIT. A conical-cylindrical concentrator, i.e., transformer of oscillating velocity (concentrator), preferably has two forms which provide the best qualities of prototypes thereof: the stepped concentrator and conical concentrator. FIGS. 4(*a*)-4(*c*) show the distributions of mechanical displacement amplitudes and diagrams of cyclic mechanical stress distribution along the transformer of oscillating velocity (concentrator). More particularly, FIG. 4(*a*) shows the distribution of mechanical displacement amplitude and mechanical stress in a stepped transformer of oscillating velocity. FIG. 4(*b*) shows the distribution of mechanical displacement amplitude and mechanical stress in a conical transformer of oscillating velocity. FIG. 4(*c*) shows the distribution of mechanical displacement amplitude and mechanical stress in the conical-cylindrical transformer of oscillating velocity. A conical-cylindrical concentrator, as shown in FIG. 4(*c*), has the following benefits:

In comparison with the stepped concentrator, as shown in FIG. 4(*a*):

The zero collar 64 is displaced relative to maximal mechanical stresses, thereby increasing the strength, decreasing the influence of Poisson's displacements in the area of transducer fixation which leads to a decrease in the loss thereof, and transducer failure along the zero collar is impossible. The oscillating system operates more stable.

Concentrator configuration has no abrupt transitions along the axis; at amplitudes of more than 50 μm, uncontrollable failure of longitudinal oscillations and transformation thereof into transverse oscillations of the working end do not occur.

In comparison with the conical concentrator, as shown in FIG. 4(*b*):

Amplitude of mechanical displacements is increased. The conical concentrator has the conversion factor of 2.6 contrary to the conical concentrator having the conversion factor of 1.8.

Figures 5A, 5B:
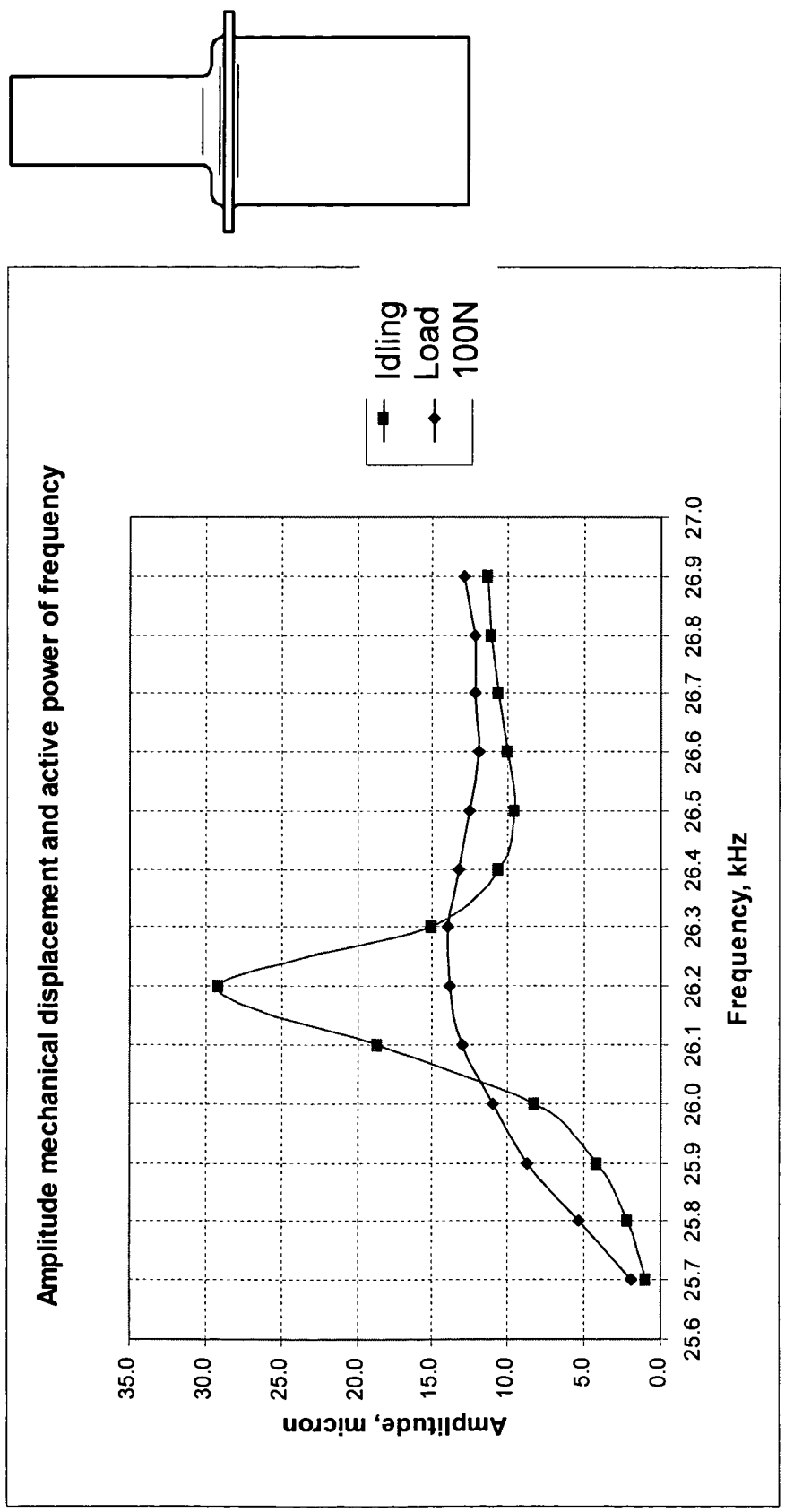
FIGS. 5(a)-5(d) show comparison characteristics of stepped and conical-cylindrical concentrators, respectively, as to energy output.
Figures 5C, 5D:
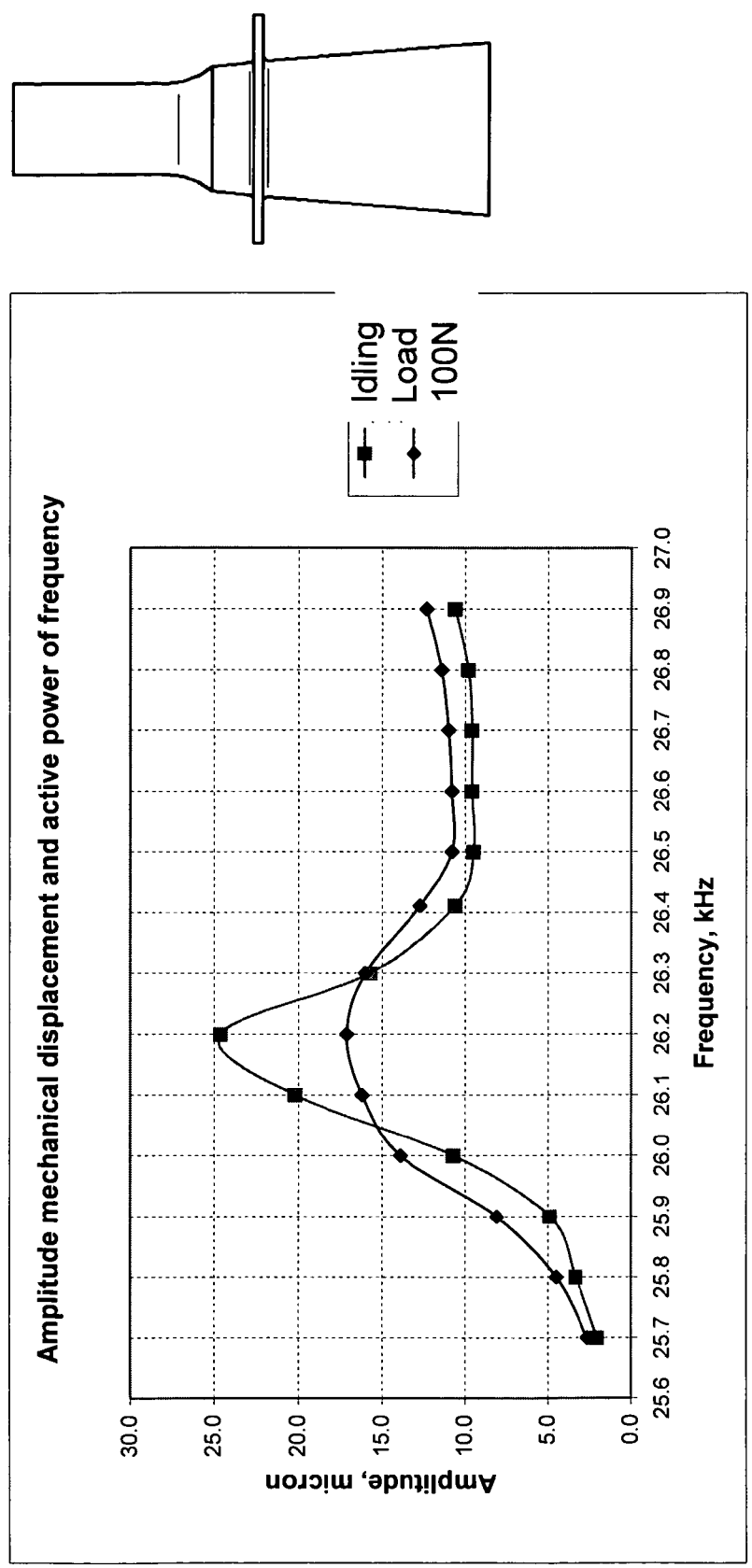
Figure 6A:
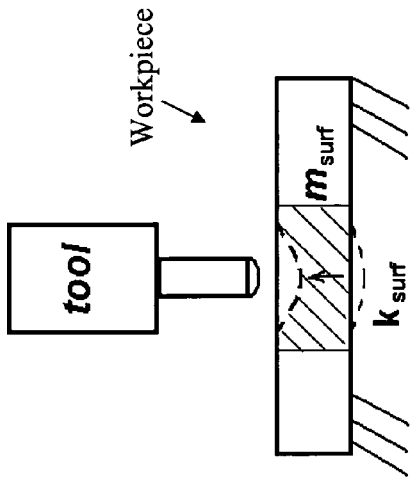
FIG. 6(a) shows a frequency spectrum of an impact of the lumped mass, which is equivalent to the tool mass, upon a workpiece of a certain elasticity oscillating due to the impact.
Figure 6B:
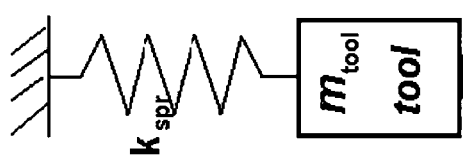
FIG. 6(b) shows a schematic representation of an impact of the lumped mass (of the tool) upon a workpiece of certain elasticity.
Figure 6C:
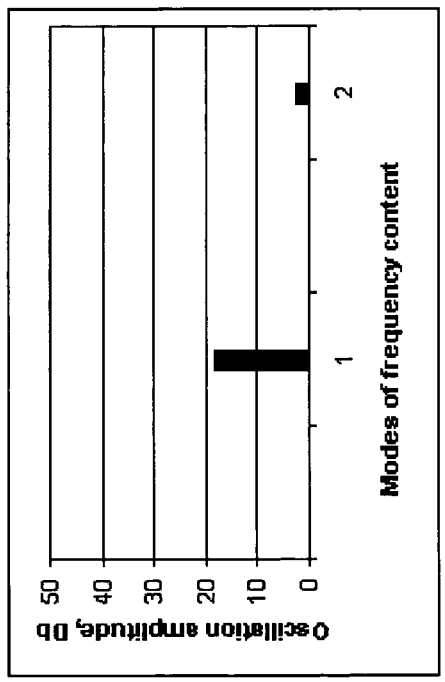
FIG. 6(c) shows a frequency spectrum of an impact of lumped mass of a chart of an ultrasonic tool, which is suspended on a spring of a certain elasticity.
Figure 6D:
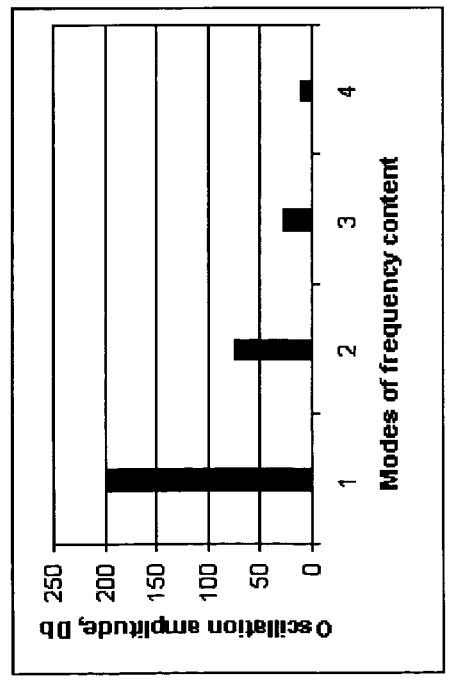
FIG. 6(d) shows a schematic representation of an ultrasonic impact by a tool suspended on a spring of a certain elasticity.
Figure 7A:
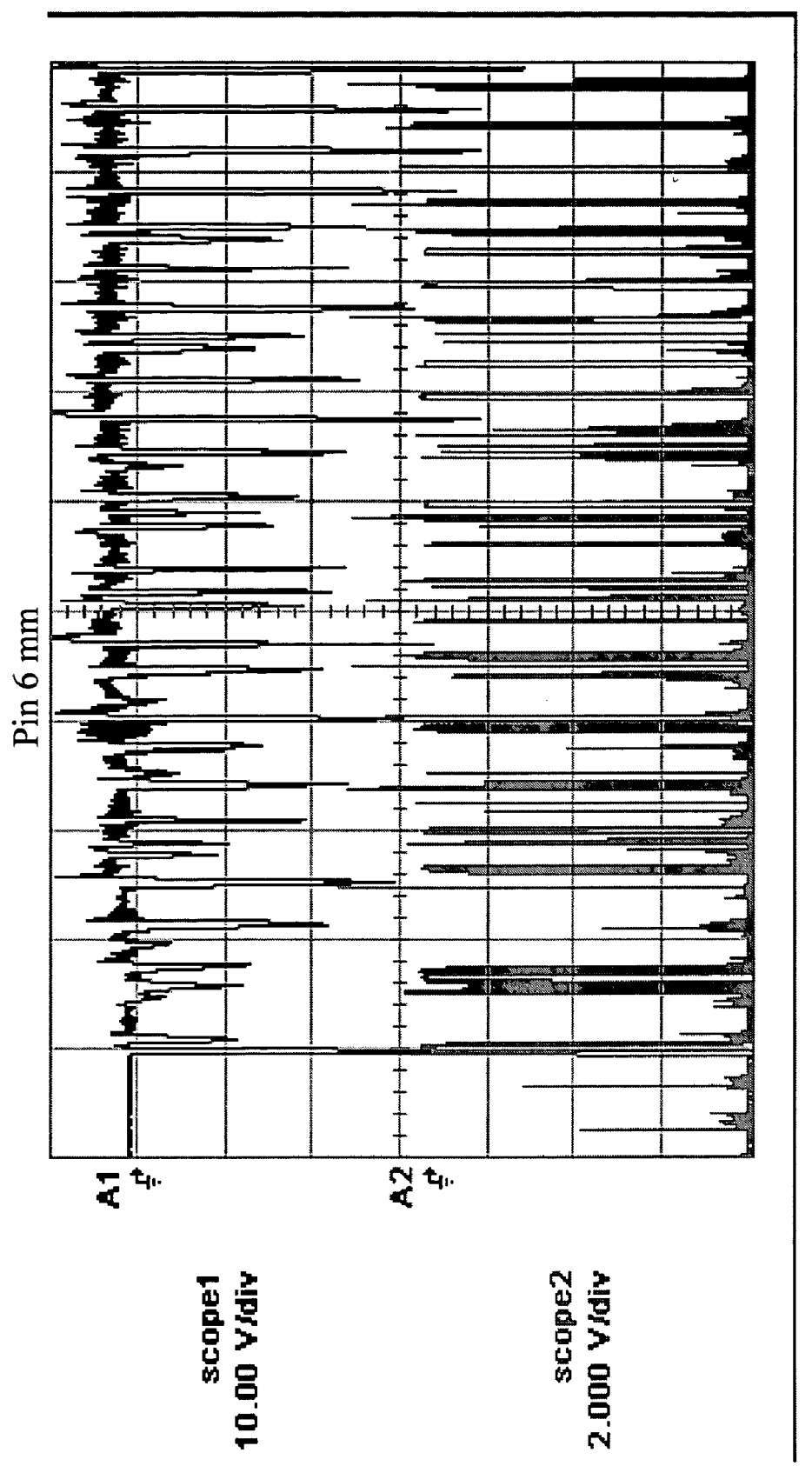
Figure 7B:
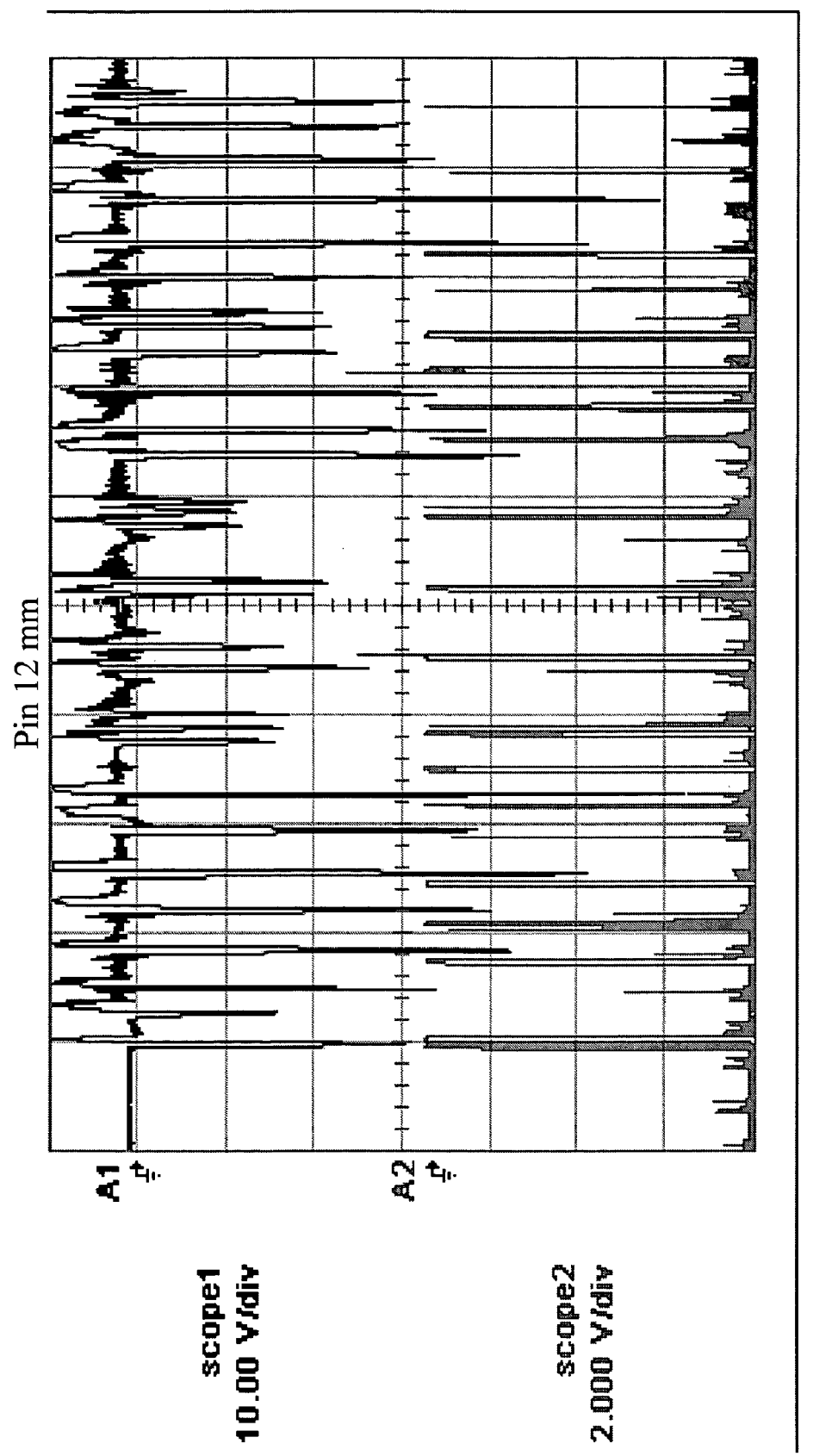
Figure 7C:
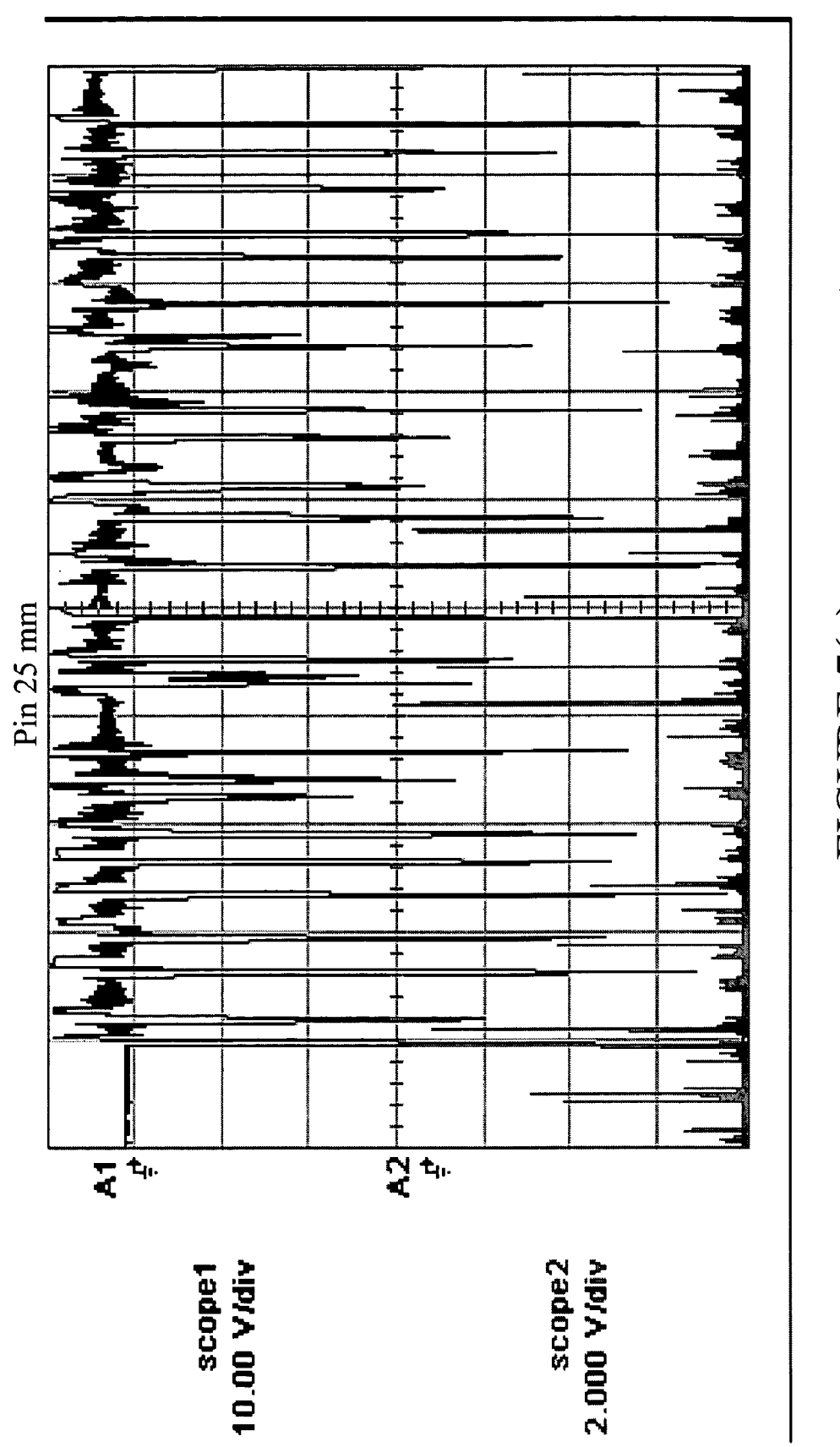
Figure 7D:
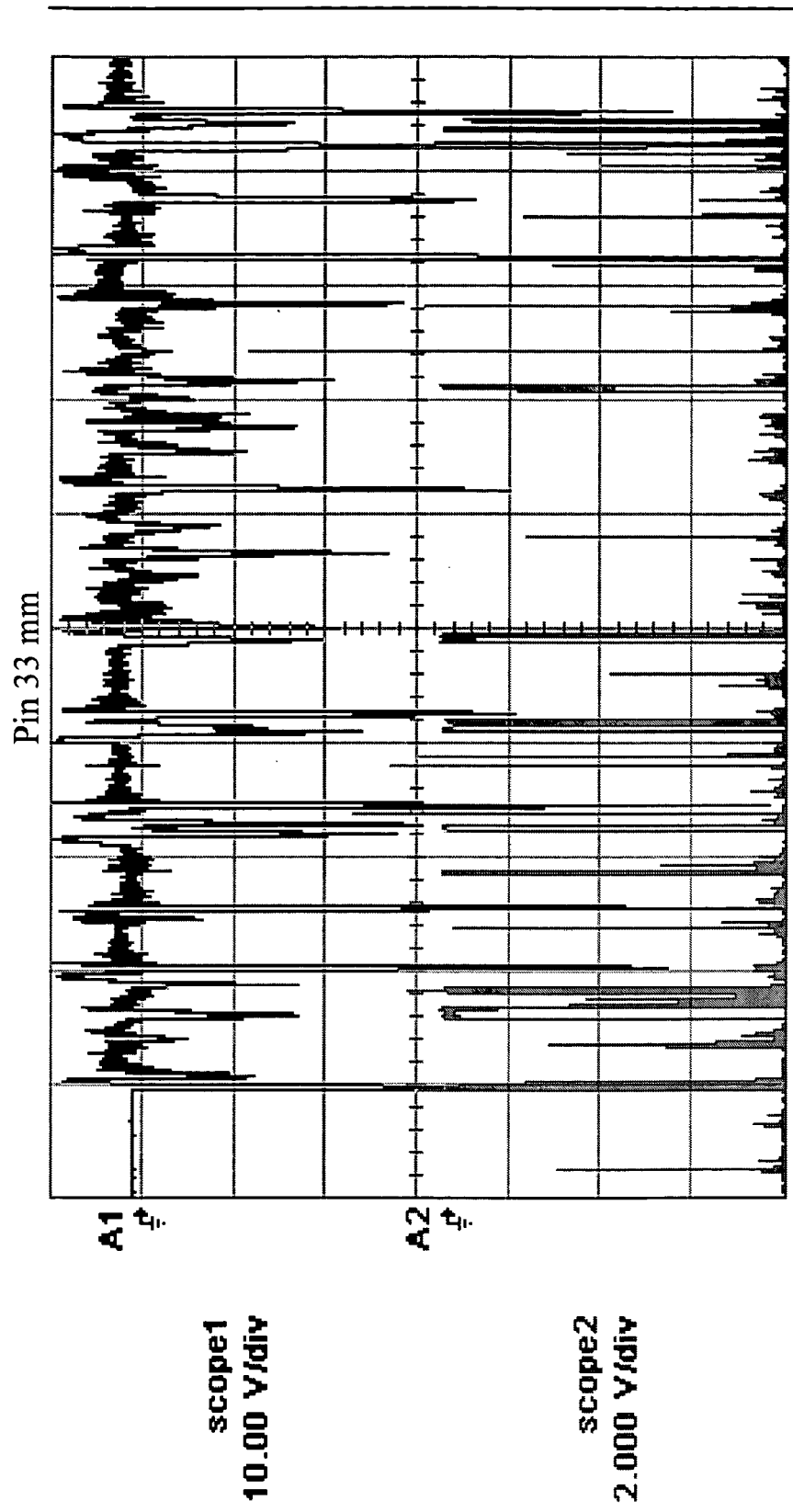
Figure 7E:
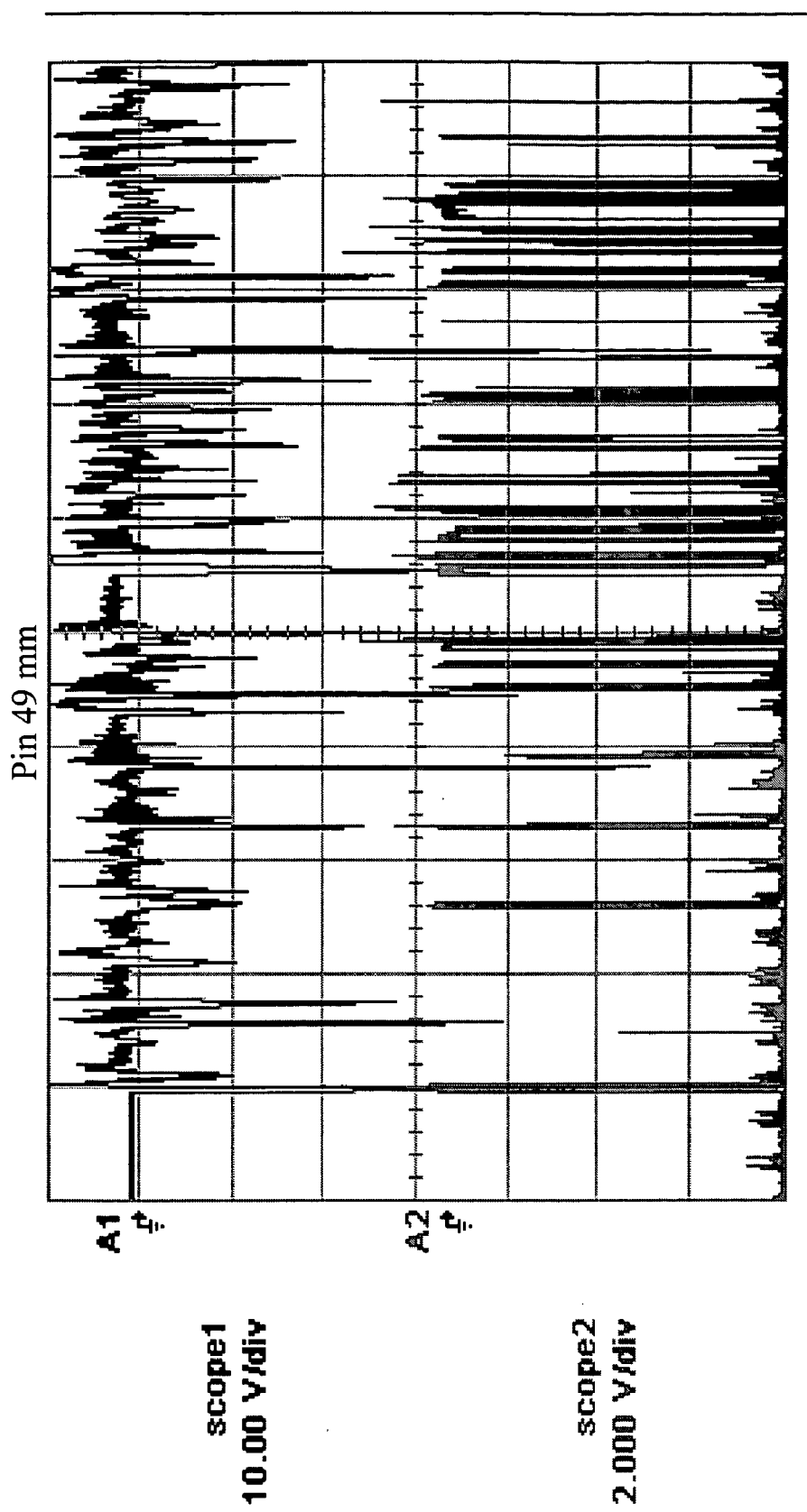

A transducer with a conical-cylindrical concentrator has higher energy output than a stepped concentrator. The diagrams in FIGS. 5(*a*)-5(*d*) show the statistic results of measuring of amplitude-frequency characteristics. Specifically, FIG. 5(*a*) shows the amplitude mechanical displacement and active power of frequency for a stepped concentrator as illustrated in FIG. 5(*b*), while FIG. 5(*c*) shows the amplitude mechanical displacement and active power of frequency for a conical-cylindrical concentrator (CCC) as also shown in FIG. 5(*d*). As a result, an amplitude thereof is lower under no-load and higher during impact and hence, the treatment efficiency is higher.

FIGS. 6(*a*)-6(*d*) show frequency characteristics of basic components of an oscillating system activated by an impact. More particularly, FIG. 6(*b*) shows a workpiece with elasticity $k_{surf}$ during impact. A workpiece portion with elasticity $k_{surf}$ has an average local mass $m_{surf}$ reduced to the impact region. The square root from the relationship between $k_{surf}$ and $m_{surf}$ characterizes a first oscillation mode in the system. A frequency spectrum of the workpiece is shown in FIG. 6(*a*), where the second, third and following oscillation modes are divisible to the first mode.

FIG. 6(*d*) shows an ultrasonic tool with spring elasticity $k_{spr}$. The ultrasonic tool has an effective mass $m_{tool}$. The square root from the relationship between $k_{spr}$ and $m_{tool}$ characterizes a first oscillation mode of the system "tool-spring" as well. A frequency spectrum of this system is shown in the graph of FIG. 6(*c*), where the second, third and following oscillation modes are divisible to the first mode. Therefore, the spring parameters are prescribed to satisfy the equation:

$$N_{surf} \times \sqrt{\frac{k_{surf}}{m_{surf}}} = N_{tool} \times \sqrt{\frac{k_{spr}}{m_{tool}}}$$

where $N_{surf}$ and $N_{tool}$ are the sequence numbers of the oscillation modes of the treated surface and the tool, respectively.

FIGS. 7(a)-7(f) show indenter 31 length of the present invention determined to provide maximal efficiency of the treatment. Scope 1 is a signal from a piezoelectric lamination under a treated surface and Scope 2 is a signal from a contact sensor. The level and duration of the "Scope 1" signal are directly proportional to the plastic deformation introduced into a workpiece. The "Scope 2" signal corroborates impact influence. Efficiency of the treatment is valued by surface plastic deformation expressed in terms of indentation dimensions per time unit. The data given in the diagrams (FIGS. 7(a)-7(e)) and the table (FIG. 7(f)) show maximal treatment efficiency to be achieved by an indenter 31 having a length of not less than 1/12 and not more than 1/4 from a wavelength at a resonance frequency of the transducer as a part of the tool.

FIG. 8(a) shows a press system of an indenter 31 to a waveguide 33. The waveguide 33 has a zero collar 64a within an area of minimum amplitude of mechanical displacements, which is a stop for the spring 42a. A resonance half-wave bracket 80 presses the indenter 31 against the tip of the waveguide 33 through the spring 42a, which rests upon the zero collar 64a and the internal ring nut 88 with the lock nut 90, which serve as an internal thrust flange of the bracket 80. The bracket resonance dimensions provide possible oscillations, which are synchronous to the waveguide 33. The indenter 31 is pressed between the waveguide 33 and the resonance bracket 80, and may, according to definite process tasks, be of various shapes including, but not limited to, spherical 31', conical 31" or rod 31'" shaped, as shown in FIGS. 8(b)-8(d), respectively. The indenter 31 to waveguide 33 tightening level is ensured with a nut 88 and a lock nut 90. The extent of a press determines an equivalent mass value along with an impact value and duration. Such a system provides a controlled acoustic coupling between the indenter 31 and the waveguide 33 and can provide contact by ultrasonic treatment of a surface without a tool rebound therefrom apart from ultrasonic impact treatment accompanied by a rebound. More particularly, the indenter 31 preferably includes at least one cylindrical, conical or spherical indenter which is provided for with a possibility of free movement along an axis of an oscillating rate concentrator, and which is attached to an output tip of the concentrator with a resonance bracket at an oscillating system frequency, and attached to the zero collar of the concentrator through the spring pressed by a controlled force of a nut upon fixing with a lock nut. The nut and the lock nut are preferably fitted on an internal thread of the resonance bracket within an antinode of its displacement.

The indenter 31 of the present invention has an improved shape. The working tip of the indenter 31 is preferably wedge shaped and has two radii, preferably a smaller radius R1 and a larger radius R2. As shown in FIGS. 9(a) and 9(b), radius R2 may preferably vary from 10 mm and more, providing the required roughness during treatment. The roughness is preferably 100 microinches and less. Radius R1 may preferably vary from 0.5 mm and more, providing the required quality of an interface between a groove and a parent metal. The smaller radius R1 also provides a groove of a specified interface radius. This indenter shape allows effective ultrasonic treatment of a groove on the heat-affected zone with a specified surface roughness, microhardness, and the magnitude and depth of induced compressive stresses. The indenter 31 preferably achieves a level and distribution of ultrasonic impact initiated residual stresses which are sufficient for compensation of in-service action of external forces that create a risk of treated material failure in zones affected by stress concentrators. A high energy density in the area of a localized and recurring impacting contact and an increase in the number of pins in the pin holder do not disrupt the stability of the oscillating system operation, such as when using one-radius indenters.

Figure 10:
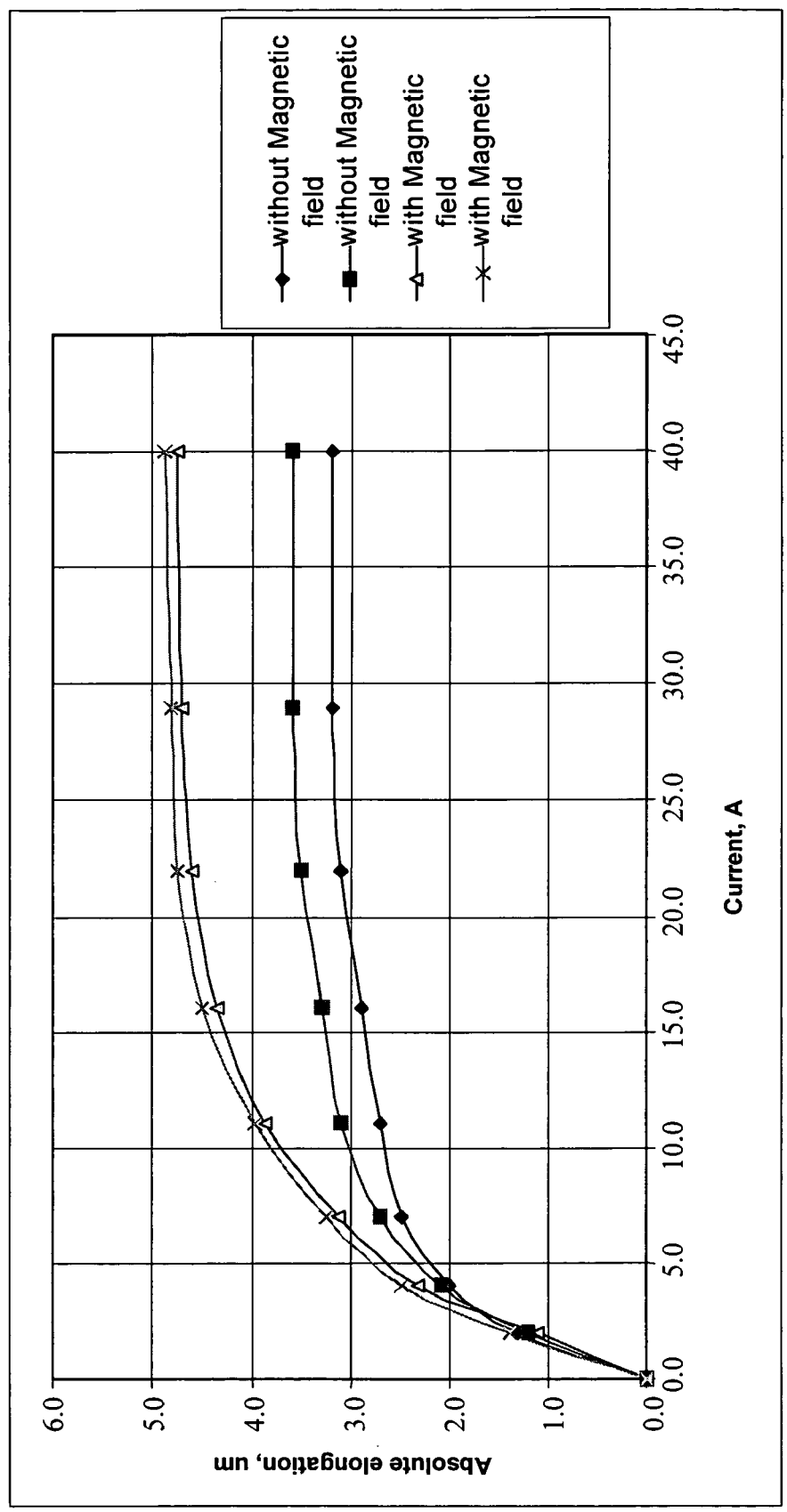
FIG. 10 shows statistic results of core annealing with and without a magnetic field.

An increase in the magnetostriction coefficient and stabilization of electro-acoustic characteristics of magnetostrictive cores 61 are obtained by annealing of the latter in a vacuum, an inert gas or combination thereof with a magnetic field affecting a lamination plane normal to a long side of the core at a magnetic force suitable for limiting polarization of magnetic domains along the magnetostrictive core at temperatures appropriate to pass through the Curie point in both directions. The preferred magnetizing force is about 1000 A/m. The annealing procedure comprises heating up to 850° C. in an argon or vacuum environment with residual pressure of not more than $10^{-3}$ Pa; soaking for 5 hours; and cooling down to 400° C. at a rate of 100° C./hr. A magnetic field is preferably applied about an hour before cooling down begins. A magnetic induction vector is preferably directed normal to the core lamination length and parallel to the core lamination plane. FIG. 10 shows the averaged statistic results of measuring the magnetostriction coefficient of the cores annealed with and without a magnetic field. The magnetostriction coefficient displacement from the average statistical value decreases down to about 5% due to the annealing with the magnetic field. In comparison, conventional technologies of annealing without a magnetic field have the scatter of magnetostrictive parameters of cores from different batches up to 15%.

The magnetostrictive core of the transducer is brazed to the concentrator (transformer of oscillating velocity) in a vacuum up to $10^{-4}$ Pa by short-term heating and cooling at a rate of 17° C./min. using argentiferous or any other strap brazing alloy of a thickness of about 0.1 mm and a finely-dispersed titanium powder acting as a flux causing permendure to be wetted by brazing alloy to a height of about 0.1 mm and less of a web height at a scatter of work process and oscillating systems in a batch of 5% and less after brazing. The brazing process is preferably accompanied by long heating and soaking that results in possible brazing alloy penetration up the laminations at a great height. Accordingly, the height of brazing alloy penetration may be varied. This circumstance adversely affects the electro-acoustic characteristics of the cores. Besides, long heating increases dispersion of the core magnetostrictive parameters and decreases the magnetostriction coefficient. Apart from the features referenced above, the present invention is distinct by short-term heating which makes possible, along with a titanium powder, the normalization of a height of brazing alloy penetration. Brazing time determined precisely makes it possible to normalize the height of a brazing material penetration or a joint itself and more importantly to minimize dispersion of the core magnetostrictive characteristics.

The shapes of the recess holes 92 for mounting a magnetostrictive core 61 on the concentrator end may vary. The positioning of a core 61 in the recess hole 92 made in the form of a groove along the diameter equal to the core diagonal, or as a core socket in the form of the core tip, as shown in FIGS. 11(a) and 11(b), eliminates machining after brazing.

FIGS. 12(a)-12(e) show various configurations of the waveguide 33 working tips including, but not limited to, a straight tip [FIG. 12(a)], such as for normal surface treatment; a skewed tip on the short side [FIG. 12(b)], such as for the treatment of a heat-affected groove at a small angle between welded metal sheets; a skewed tip on the long side [FIG. 12(c)], such as for the treatment of internal right angles; a skewed tip on the long and the short sides in a left direction [FIG. 12(d)], such as for the treatment of right internal acute angles; and a skewed tip on the long and short sides in a right direction [FIG. 12(e)], such as for the treatment of left internal acute angles. Technical waveguides 33 having different configurations provide the identical amplitude of mechanical displacements of the working tips. An increase in waveguide working tip resistance to failure under impacts is preferably obtained by argon-arc hardfacing with oxidized titanium to a height of about 2 mm to 6 mm and following strengthening thereof.

Figure 13:
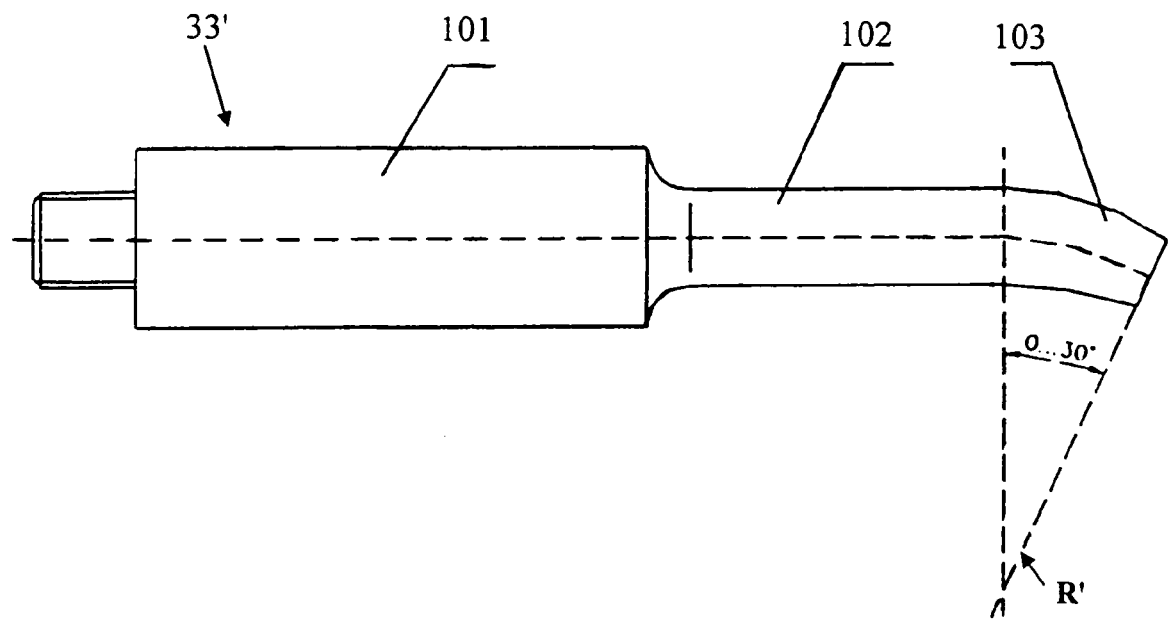
FIG. 13 shows a curved technical waveguide.

In another embodiment, the waveguide 33 of the present invention may be curvilinear. FIG. 13 shows a curvilinear waveguide 33' for the treatment of hard-to-access areas and narrow spots. The curvilinear waveguide 33' preferably has a rotation of surfaces of equal phases in sections normal to the centers of distributed masses forming the waveguide body. This rotation is preferably 30° or less. The curvilinear waveguide 33' comprises a low-amplitude part 101, and high-amplitude parts 102,103. These parts of the curvilinear waveguide 33' may have any shape in axial section. The low-amplitude part 101 is preferably rectilinear and smoothly passes in the high-amplitude part 103 which is preferably curvilinear by way of high-amplitude part 102. The high-amplitude part 103 preferably has the length along the waveguide axis such that an angle of a sector of a circle is formed by the axis thereof and the radius R' limiting it is preferably not more than 30°. Specifically, a uniform distribution of ultrasonic displacements on a waveguide skewed tip in any specified direction is obtained at a negative angle of up to 30°. In this embodiment, ultrasonic oscillations spread along the waveguide axis at a high resistance to transverse oscillation initiation.

Figure 14:
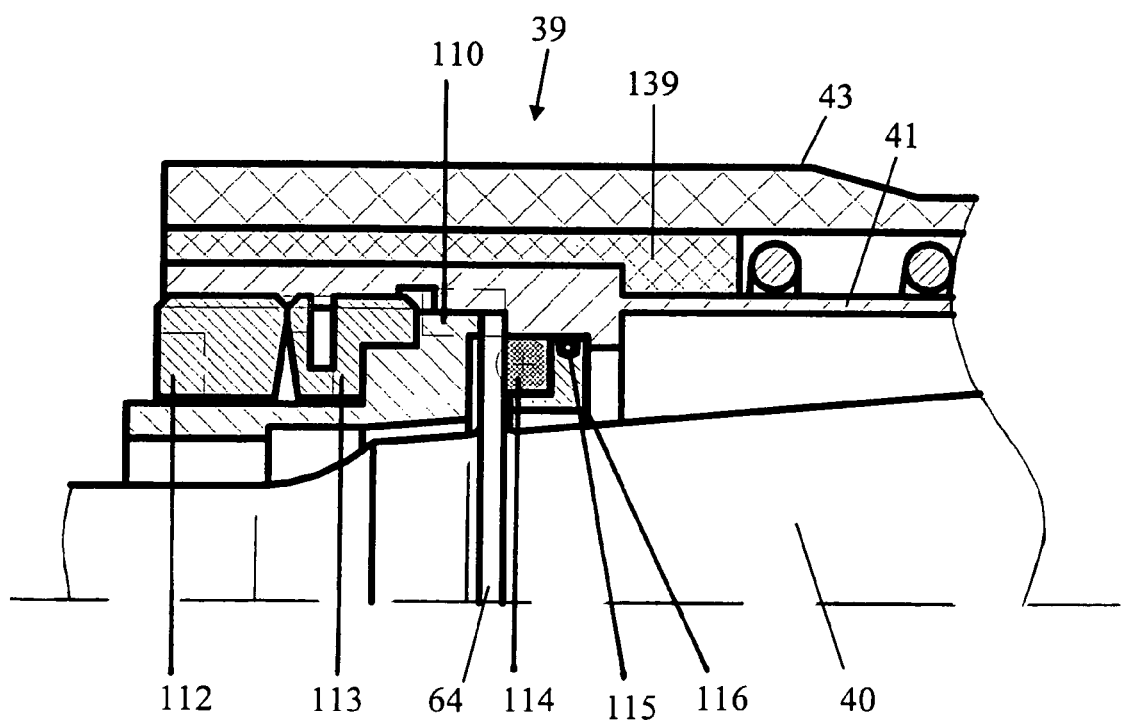
FIG. 14 shows a sealing assembly where a magnetostrictive transducer is fixed to a zero collar.

Referring to FIG. 14, a key 110 is preferably welded or tightly fixed in the key slot of the transducer case 41. The zero collar 64 of the transducer 40, also shown in FIGS. 1 and 3(a), has a slot for the key 110. This slot is also made on the bracket 36. Thus, the oscillating system is safely oriented relative to the transducer case 41 and spontaneous turning of the oscillating system in the transducer case 41 is prevented during tool operation. Turning of the transducer case 41 is prevented and its axial movement relative to the tool body is limited by using special lock screws 139, which are mounted in the transducer case 41, or by using the output assembly 50 mounted at an ergonomically set angle, e.g., by screwing the output assembly 50 into the bushing 45 rigidly attached to the transducer case 41. Thus, in a specific case, relative to the tool body 43, an angular fixed position of the transducer and oscillating system in whole is achieved by the guide key 110 in the transducer case 41 along the zero collar 64 of the transducer 40 and by lock screws 139 and/or the output assembly 50. This engineering solution guarantees stable operation of the tool 30 by multiple-unit sets of indenters 31 during treatment of prolonged and developed surfaces.

FIG. 14 also shows the sealing assembly 39 over the zero collar 64. The sealing assembly 39 comprises a rubber or elastomeric ring 114 and a split collar 116 comprised of two semi-rings which are reflecting symmetric to the axial plane therebetween in the assembled condition. A split lock washer 115 holds the semi-rings assembled and moves freely relative to the low-amplitude portion of the transducer 40. Before pressing, the rubber or elastomeric ring 114 lays freely in the socket between the zero collar and the split collar 116 without any tightness or initial deformation. This ensures (1) free mounting of the rubber or elastomeric ring 114, (2) free, uniformly distributed deformations as this is pressed, (3) reliable filling of gaps by pressing and (4) free disassembly after release of pressing without force application and deformation of the rubber ring 114 upon removal thereof, e.g., for preventative maintenance or repair of the tool, if necessary. The cross-sectional area of the rubber or elastomeric ring 114 is preferably equal to the cross-sectional area of the socket formed by the split collar 116 and the zero collar (flange) 64. The rubber or elastomeric ring 114 preferably overhangs the split collar 116 edge about 1-2 mm or less. Therefore, tight (but without overdeformation) pressing of the rubber or elastomeric ring 114 to the zero collar 64 of the concentrator of oscillating velocity of the magnetostrictive transducer 40 occurs with minimal deformation of the rubber ring 114 and uniform filling of all gaps that may leak. This is how this critical joint is reliably sealed.

FIG. 14 also shows a thread joint having highly reliable stopping under action of ultrasonic oscillations, impacts and oscillations on the tool. The main nut 113 has a groove forming in the elastic ring in the body of the main nut 113. The elastic ring tip preferably has a conical recess hole. After the main nut 113 is tightened, it is preferably locked by a locking nut 112. The locking nut 112 presses on the conical tip of the main nut 113, thereby ensuring stopping of the main nut 113 through the elastic ring thereof.

Figure 15:
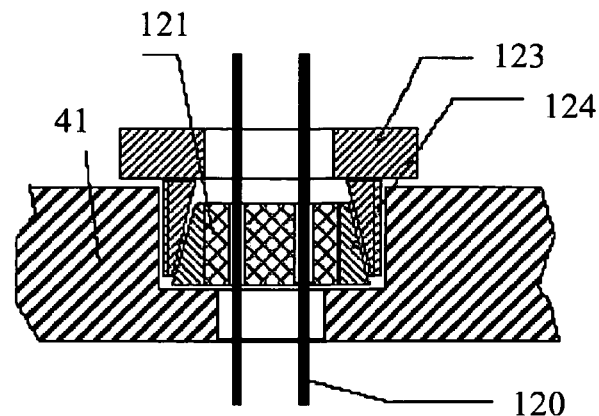
FIG. 15 shows a cable sealing assembly.

FIG. 15 shows a rear tip of a transducer case 41 close to a wire input-output. The transducer case 41 preferably has a hole for wires 120. The upper portion of the hole is preferably enlarged and has a nut 123 twisted therein. The nut 123 preferably has an axial conical through-hole. The nut 123 rests against a conical slot washer 124 which holds an elastic retainer 121. The elastic retainer 121 is tightly fixed in the conical slot washer 124. During tightening, the nut 123 presses the conical slot washer 124, which presses the elastic retainer 121 in a radial direction, thereby providing a tight joint and good sealing without creating, along the axis of sealing, deformation friction forces that used to break the sealing.

Figure 16:
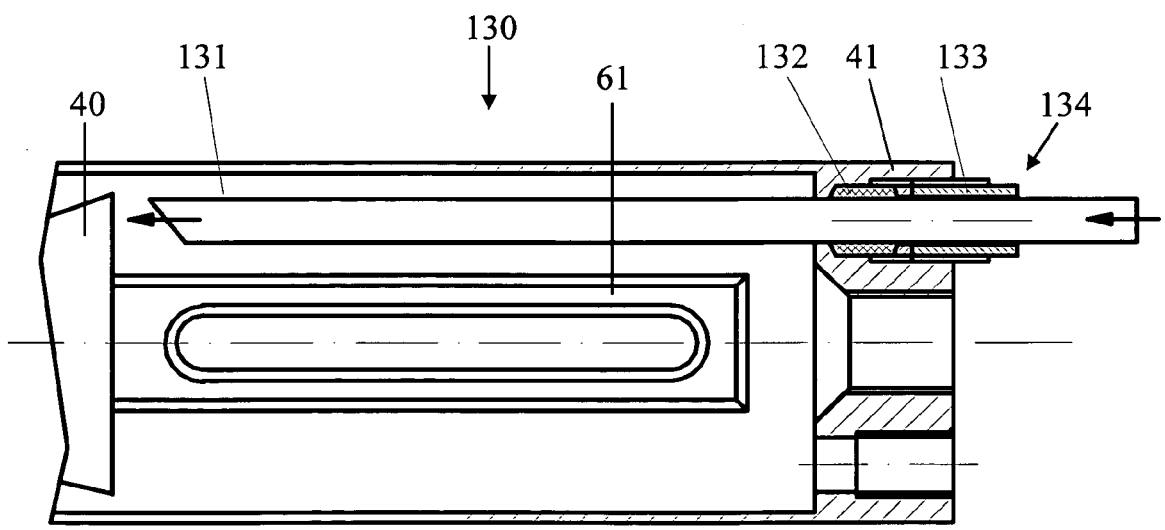
FIG. 16 shows a magnetostrictive transducer cooling assembly.

FIG. 16 shows a cooling assembly 130 of the magnetostrictive transducer 40. The cooling assembly 130 comprises a tube 131, a nipple 133 and an elastic retainer 132. The tube 131 is tightly fixed or brazed to the internal hole of the nipple 133 or made integrally therewith. The tube 131 and the nipple 133, which is preferably in the form of a tube, are pressed to the transducer case 41 by the elastic retainer 132. The nipple 133 is in the transducer case 41 between the magnetostrictive core and an internal wall of the transducer case 41. The retainer 132 ensures a damp-proof seal between the tube 131 and the transducer case 41. The tube 131 extends beyond the magnetostrictive core 61, but does not rest against the concentrator tip. The nipple outlet 134 when installed, does not extend internally beyond the end of the transducer case 41. A cooling liquid arrives through the tube 131 providing magnetostrictive core cooling. More particularly, the cooling assembly 130 of the magnetostrictive transducer 40 comprises an elastic seal, such as for example an elastic retainer 132; an inlet nipple 133 with a tube 131 inserted in the transducer case 41 between the magnetostrictive core 61 and an internal wall of the transducer case 41, wherein the length of the tube 131 extends beyond the magnetostrictive core 61 of the magnetostrictive transducer; and an outlet nipple 134 which, when installed, does not extend internally beyond the end of the transducer case 41.

Figures 17A, 17B:
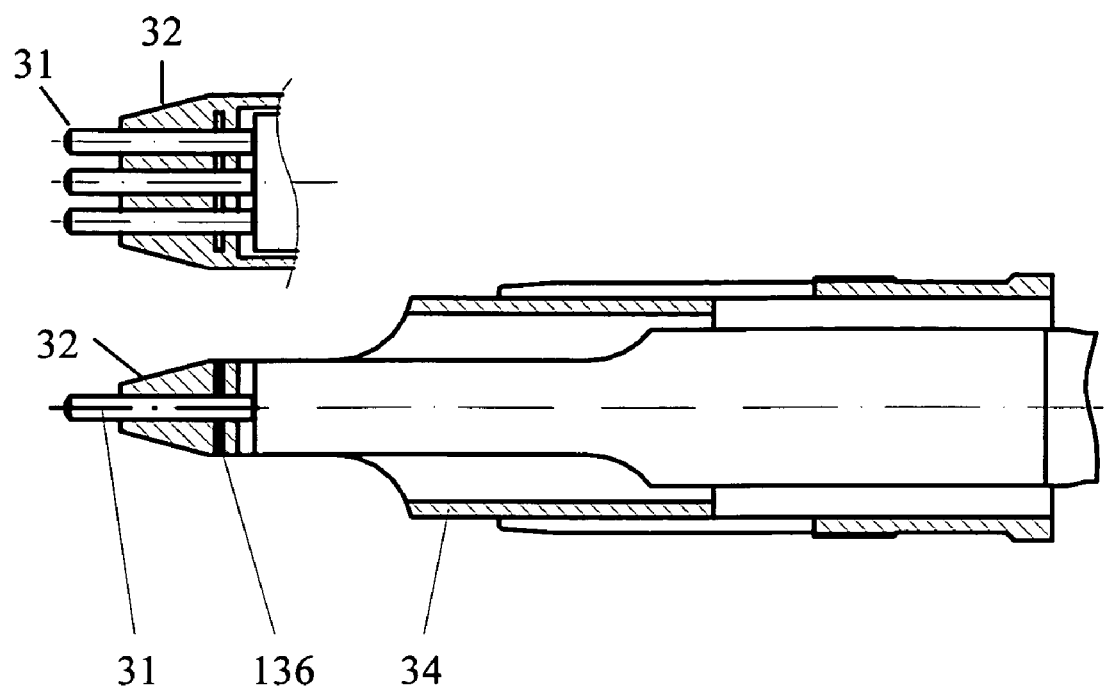
FIG. 17(a) shows a side view of a pin fixation assembly.
FIG. 17(b) shows a top view of the pin fixation assembly of FIG. 17(a)

FIGS. 17(a)-17(b) show the assembly of indenters 31 fixed in the pin holder 34, also shown in FIG. 1. A slot 136 is preferably cut through and within the head of the pin holder 34. A thermoelastic retainer plate 32 with holes for the indenters 31 is preferably mounted in the slot 136. The diameter of the holes preferably ranges from about 0.5-1 mm smaller than the diameter of the indenters 31 and a thickness of 0.8-1.0 mm. In a preferred embodiment, the indenters 31 are reliably mounted in guide channels by elastic tightness of the holes in the thermoelastic retainer plate 32. Specifically, the retainer plate is inserted into a transversal slot of a width of about 0.8-1.5 mm in the working part of the pin holder 34 with at least one indenter passing through the slot perpendicular to the plane thereof.

Additional embodiments of the invention include UIT tools that can preferably be used in confined spaces and/or where the use of water is not possible for cooling a transducer of the tool. A preferred embodiment includes an assembly and brazing technique for a magnetostrictive core which provides reliable bonding between the magnetostrictive core and concentrator under critical dynamic and quasistatic loads. This technique is distinct due to the quality and consistency of assembly for brazing, an increased total area of a brazed joint, and polarization of domains and stabilization of their structure in a magnetic field under elevated temperature and after cooling, respectively.

A preferred embodiment of the tool provides a means of concentrating oscillating velocity under critical dynamic and quasistatic loads. The "criticality" of this condition is defined by the spatial orientation of the treated area and the magnitude of residual stresses at the level of limiting characteristics of the material being treated. The concentration means are at the same time the waveguides which are intended to create such stresses.

Another preferred embodiment of the invention is a tool for ultrasonic impact treatment in hard-to-access areas and confined spaces. A distinctive feature of this embodiment of the tool is that the oscillating velocity vector at the output of the technical waveguide may rotate at an angle of at least 90° relative to the transducer axis. The tool may also have suspension to ensure acoustic decoupling from vibrations and impacts on the tool body. The distinctive features thereof include possible compensation of vibrations initiated by oscillations in both directions (along and perpendicular to the transducer axis), higher susceptibility to synchronous excitation at a frequency of ultrasonic impacts initiated by resonance oscillations of the ultrasonic transducer at a carrier frequency, as well as ergonomic location appropriate to the use conditions, simple assembly/disassembly and internal configuration of the tool body.

Another embodiment of the tool has air cooling of the magnetostrictive transducer. The distinctive features thereof preferably include use of an axial fan in field conditions; use of compressed air (compression) under stationary manufacturing conditions; and use of a heat-resistant adhesive impregnating compound for electric insulation of magnetostrictive core plates and for improving acoustic stiffness of the magnetostrictive core.

The tool of the invention is protected against cavitation damage in the area of brazing and at the magnetostrictive core end. The distinctive features include the use of the effect of moving the cavitation area from an area, which is critical for the oscillating system, the partial suppression of cavitation due to a boundary effect and the improved relative cavitation resistance of a cooling medium, respectively.

In one embodiment, a replaceable guide insert may preferably be installed in the pin holder to extend the life of the pin holder, reduce manufacturing costs thereof when repair is needed, and facilitate tool operation in long-term field and stationary conditions.

Various embodiments and aspects thereof are described in further detail hereafter.

FIGS. 18(*a*) and 18(*b*) show a transducer 40 with a brazed magnetostrictive core 61. In the magnetostrictive core 61, the ends of the plates 160 are regularly staggered with a displacement ranging from about 0.05 mm to 0.5 mm therebetween to increase the contact area in a brazed joint. This engineering solution provides high strength characteristics of a brazed joint and long life for the entire transducer.

FIGS. 19(*a*) and 19(*b*) show a concentrator of the magnetostrictive transducer 40 of the invention with a round recess 92 to retain an excess design volume of a molten brazing alloy and form a fillet in a brazed joint and to prevent the brazing alloy from flowing onto a side surface of the concentrator during brazing.

FIG. 20 shows a process of brazing in a magnetic field. The transducer 40, mounted in an assembly jig 141, is in a vacuum furnace 140 at the brazing temperature of about 820° C. to about 850° C. In order to stabilize transducer characteristics, obtain high magnetostrictive coefficients and a minimum scatter of transducer characteristics within a batch, a magnetic system 142 is used that creates a constant magnetic field at the brazing area and in the magnetostrictive core 61. The constant magnetic field of the invention is oriented along a plane of magnetostrictive core plates and perpendicular to the longer side of the magnetostrictive core 61. The magnetic field has a strength sufficient to provide maximum polarization of magnetic domains along the magnetostrictive core 61 at a temperature of crossing the Curie point in both directions, as well as during cooling of the magnetostrictive core 61 within a temperature range where a domain structure of a core material is formed, which is approximately 400° C. depending on the condition and composition of permendure. In FIG. 20, "N" represents north and "S" represents south.

FIGS. 21 and 22 show an assembly jig for magnetostrictive transducer assembly and brazing with the transducer 40 mounted therein. The jig comprises a jig case 143 preferably made of heat-resistant steel, a titanium ring 144 with a socket to center the transducer concentrator and a load 145 that freely moves axially inside the jig case 143 and provides a normalized pressure on the magnetostrictive core 61 against the concentrator during transducer brazing.

Figure 23:
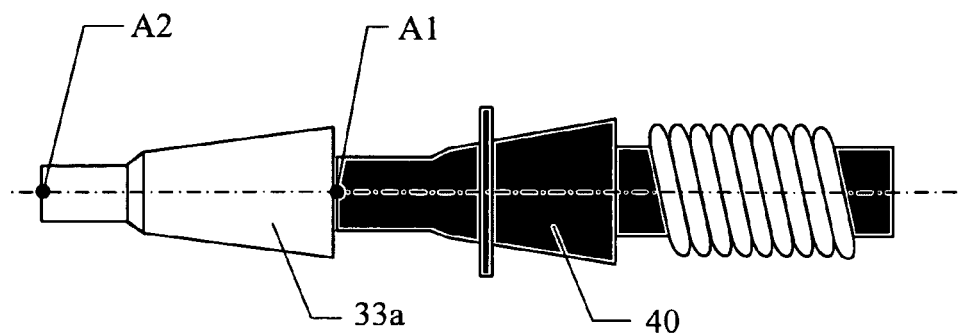
FIG. 23 shows a conic-cylindrical waveguide—a transformer of oscillating velocity—that increases the amplitude of mechanical displacements through optimizing the added mass of a waveguide primarily in the low-amplitude portion thereof. This design allows stable oscillations under dynamic and quasistatic forces that are critical for a material being treated and chosen according to the task and characteristics of the workpiece.

In another embodiment, the waveguide 33 of the present invention may be conic-cylindrical. FIG. 23 shows a conic-cylindrical technical waveguide 33*a* attached to the transducer 40. The diameter of the end of the conic-cylindrical waveguide 33*a* attached to the transducer 40 is greater than the diameter of the transducer tip attached to the conic-cylindrical waveguide 33*a*. Such a waveguide configuration makes performance of the entire oscillating system more stable and increases the amplitude of mechanical displacements at the output end of the oscillating system. Thus, the added mass of the conic-cylindrical waveguide 33*a*, specifically in the low-amplitude portion thereof, is optimized, taking into account the effect exerted on the conic-cylindrical waveguide 33*a* by limiting dynamic and quasistatic forces caused by waveguide use conditions. The conic-cylindrical waveguide 33*a* attaches to the transducer 40 at attachment point A1. An indenter 31 (not shown) is in working contact/acoustic-dynamic coupling with the conic-cylindrical waveguide 33*a* at dynamic contact point A2.

Figure 24:
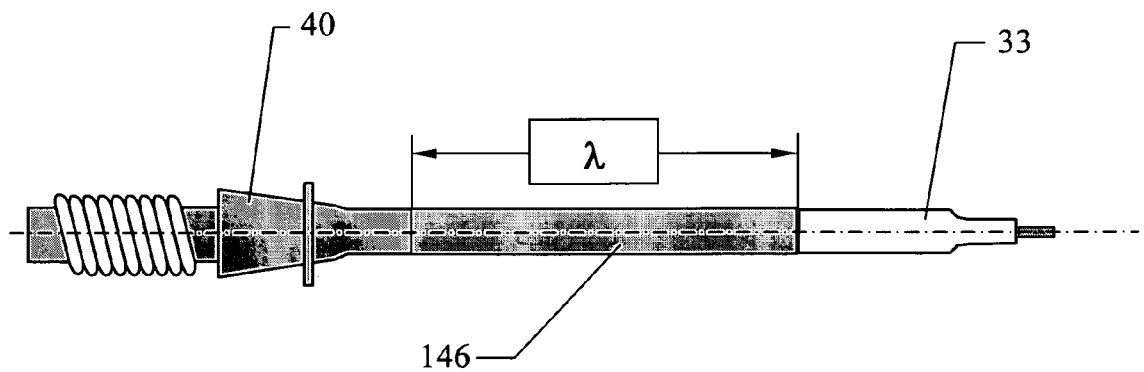
FIG. 24 shows an extension resonant waveguide designed to transmit ultrasonic oscillations from a transducer to a technical waveguide during treatment of the surfaces located in hard-to-access and remote areas at a specified oscillating velocity.

FIG. 24 shows an extension resonant waveguide 146 designed to transmit ultrasonic oscillations at a specified oscillating velocity from the transducer 40 to the technical waveguide 33. The extension resonant waveguide 146 is preferably attached to the transducer 40 and waveguide 33, such as by a screw mechanism. The extension resonant waveguide 146 may have any shape, such as round, needed to tune the oscillating system and a length multiple of a half-wave length at a carrier frequency of the transducer. In FIG. 24, the length of the extension resonant waveguide 146 is a wavelength λ. The extension resonant waveguide 146 can treat surfaces of any configuration in narrow spaces, hard-to-access areas and/or remote areas.

Figure 25:
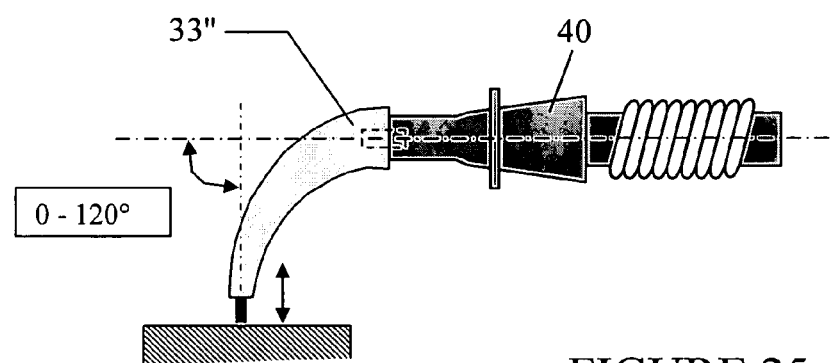
FIG. 25 shows a curved technical waveguide for treatment of surfaces in remote and/or hard-to-access areas.

In another embodiment, the waveguide 33 of the present invention may be a curved waveguide. FIG. 25 shows an example of a curved technical waveguide 33" for treatment in hard-to-access areas, remote areas and/or narrow spots. The curved waveguide 33" is formed by surface sections of equal phases in sections normal, i.e., perpendicular, to a line of centers of distributed masses which form the waveguide body, wherein the line is either predetermined for reasons of design or calculated. Based on experimental data, the rotation angle of the curved waveguide 33" may be up to 120°. The curved waveguide 33" has, in particular, a rectangular cross-section in the direction perpendicular to the axis thereof. The normalized propagation of stationary stress waves in the curved waveguide 33" is attained when the plane of the waveguide working end rotates through an angle up to 120°. In this embodiment, normal stress waves in the curved waveguide 33" will retain the normal (relative to planes of equal phases and primary stresses) highly stable oscillations with a high resistance to the onset of transverse oscillations in the curved waveguide 33".

Figure 26:
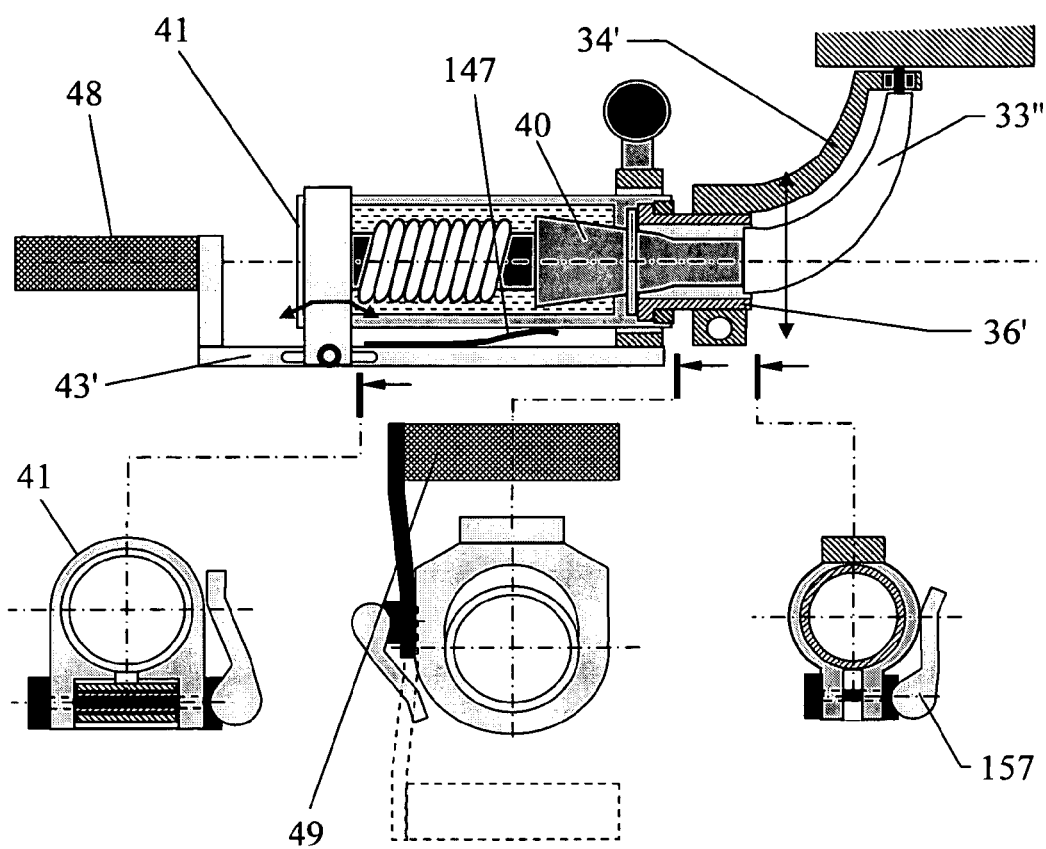
FIG. 26 shows a detail of the independent suspension of an ultrasonic oscillating system through a transducer case in a tool body.

FIG. 26 shows a detail of the independent suspension of a transducer case 41 in a tool body 43'. The transducer case 41 with the transducer 40 therein is mounted in the tool body 43' preferably by means of a pivot joint movable along the tool body 43' and is connected with the tool body 43' preferably by a flat spring 147 in the direction of the rotation of the transducer case in the pivot joint so that the oscillating system, which comprises the transducer 40, transducer case 41, curved waveguide 33", indenter 31 and treated material, oscillates during operation at a natural frequency which may be synchronized with a frequency of transducer excitation pulses. During operation, an operator holds the tool body 43' by a front handle 48 and a side handle 49 that may be positioned from two sides depending on the treated surface position. The at least one indenter 31 is mounted perpendicularly to the tip of the curved waveguide 33" in the guide hole of the curved pin holder 34' which attaches to the support pin holder bracket 36' by an eccentric clamp 157.

Figure 27:
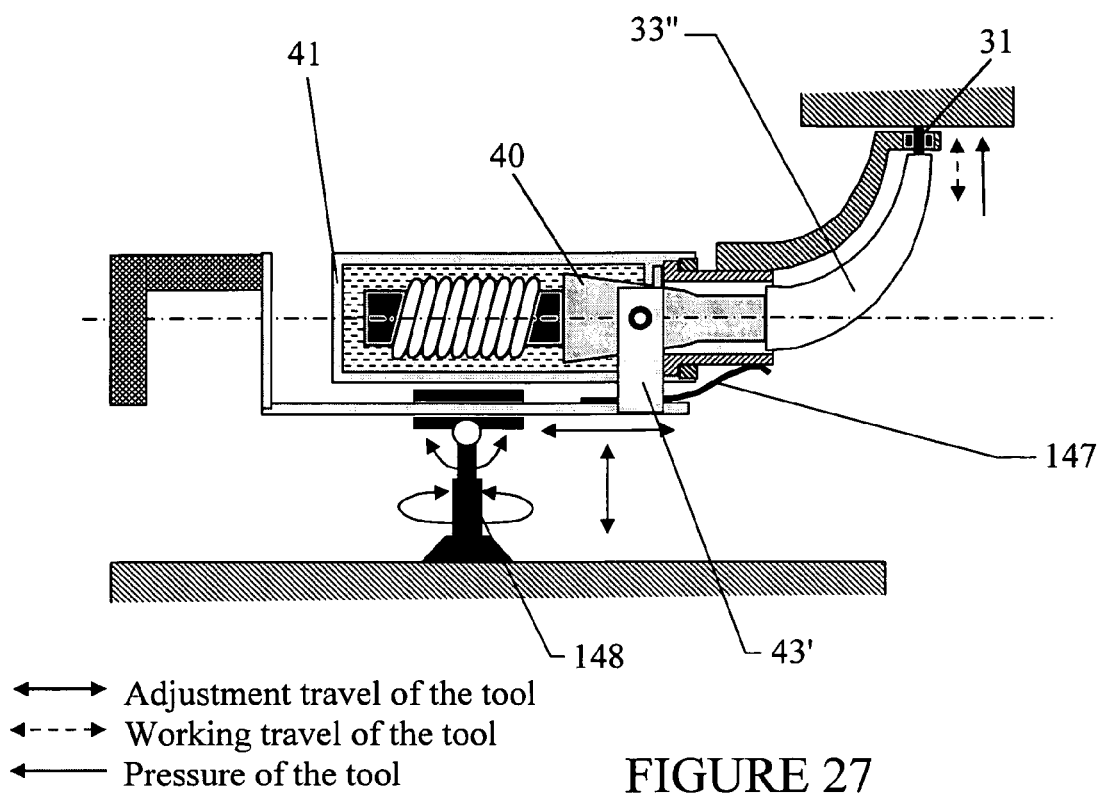
FIG. 27 shows a detail of a second embodiment of independent suspension and adjustment support of a transducer case in a tool body.

FIG. 27 shows a second embodiment of a detail of independent suspension and adjustment support of a transducer case 41 in a tool body 43'. The transducer case 41 with the transducer 40 therein is mounted in the tool body 43' preferably by means of a pivot joint and connected with the tool body 43' preferably by a flat spring 147 in the direction of the rotation of the transducer case in the pivot joint so that during operation, the oscillating system, which comprises the transducer 40, transducer case 41, curved waveguide 33", at least one indenter 31 and treated material, oscillates at a natural frequency which may be synchronized with a frequency of transducer excitation pulses. The tool body 43' is mounted on an adjustment support 148 that positions the tool body 43' during treatment through height adjustment of the support 148, moving the tool body 43' along the support 148 and tilting the tool via the pivot joint.

Figure 28:
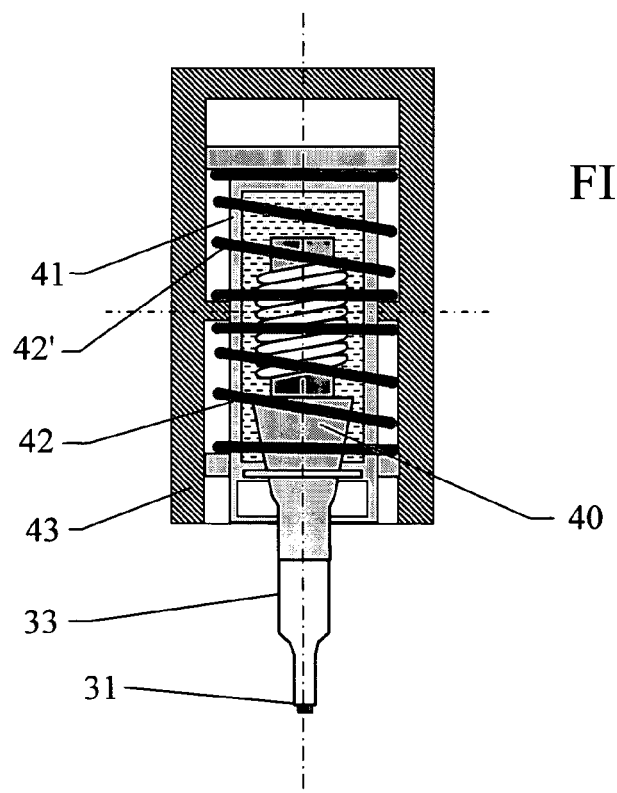
FIG. 28 shows a detail of a third embodiment of independent suspension of a transducer case in a tool body.

FIG. 28 shows a third embodiment of a detail of independent suspension of a transducer case 41 in a tool body 43. The transducer case 41 with the transducer 40 installed therein is axially connected with the tool body 43 on two sides in the direction of the transducer axis by means of two springs 42 and 42' located in the front and rear portions of the transducer case 41 so that during operation, the oscillating systems, which comprises the transducer 40, transducer case 41, waveguide 33, indenter 31 and treated material, oscillates at a natural frequency which may be synchronized with a frequency of transducer excitation pulses.

FIG. 29 shows an embodiment of a tool portion with a quick-change spring that axially connects a transducer case 41 with a tool body 43. The transducer case 41 and a bushing 45 rigidly attached thereto are axially connected with the tool body 43 by means of a spring 42" positioned between the end of the bushing 45 and the internal end surface of the tool body 43 having the front handle 48. Thus, the spring 42" is quickly accessed during tool assembly or spring replacement and friction between the spring 42", the tool body 43 and the transducer case 41 is eliminated, thereby enhancing the reliability of the entire tool.

FIGS. 30(*a*) and 30(*b*) show an ultrasonic impact tool with air cooling of the magnetostrictive transducer 40. The magnetostrictive transducer 40 is cooled by the air flow through a tube 149 at the rear end of the tool body 43, as shown for example in FIG. 30(*a*). The tube 149 is connected to a compressor, cylinder or compressed air line through a flexible hose. In another embodiment, the transducer 40 may be air cooled by means of an axial or centrifugal fan 150 built into the tool body 43, as shown for example in FIG. 30(*b*). In both embodiments, the air flow passes through the tool body 43 and the transducer case 41 along the entire oscillating system and cools the oscillating system.

Figure 31:
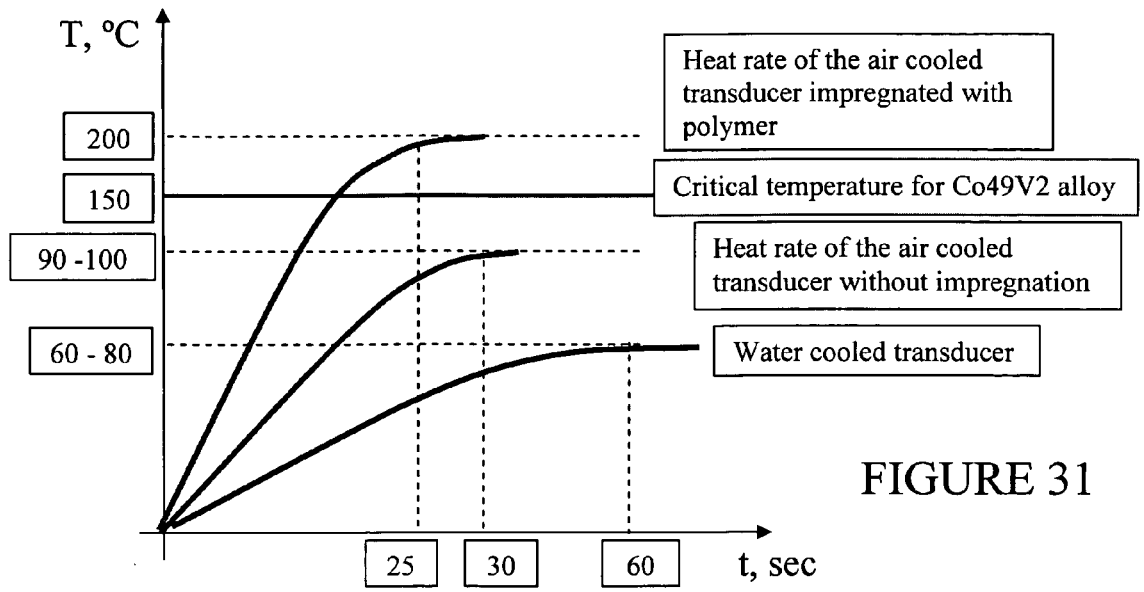
FIG. 31 shows a diagram of the heating rate of a transducer operating in water and air environment, as well as the heating rate of a high-temperature polymer used for transducer core impregnation.

FIG. 31 shows a diagram of the heating rate of a transducer operating in water and air environment, as well as the heating rate of a high-temperature polymer used for transducer core impregnation. In one embodiment, an organosilicon polymer is used as a liquid polymer to impregnate the magnetostrictive transducer 40. The operating temperature of the polymer after polymerization is at least 200° C. and the effective range thereof, as graphically shown for example in FIG. 31, lies above the curve for the critical rate of heating of magnetostrictive transducer core made, for example, of Co49V2.

Figure 32A:
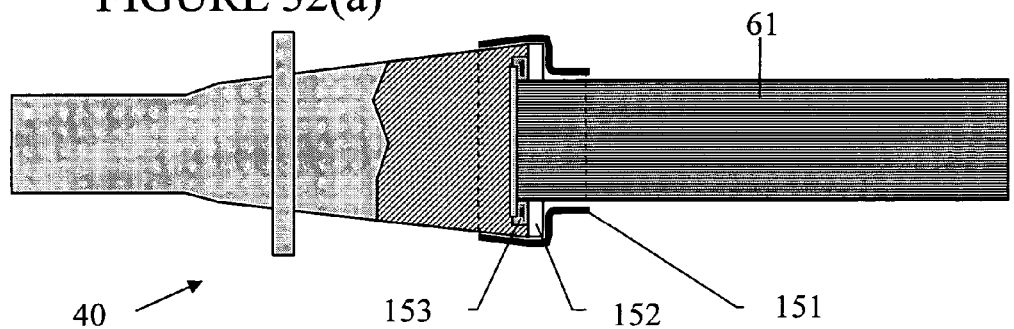
FIG. 32(a) shows a detail of a transducer brazed joint with a cavitation erosion protection means, wherein a transducer concentrator has a round recess.
Figure 32B:
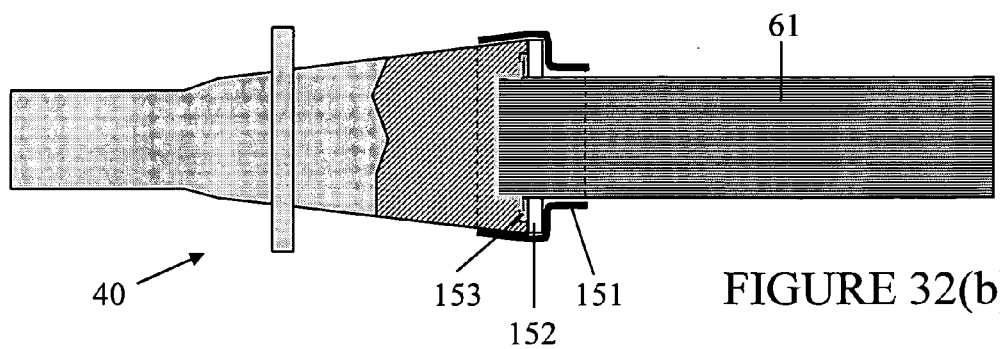
FIG. 32(b) shows a detail of a transducer brazed joint with a cavitation erosion protection means, wherein a transducer concentrator has a slot.

FIGS. 32(*a*) and 32(*b*) show a transducer 40 with a cavitation erosion protection means, which is mounted on a brazed joint and creates on the brazed joint surface the boundary conditions that prevent the formation and development of cavitation, as well as cavitation damage of brazed joint surfaces, thereby extending the life of the entire transducer. In FIG. 32(*a*), the transducer concentrator has a round recess; and in FIG. 32(*b*), the transducer concentrator has a slot. A brazed joint with a protection means which protects against cavitation erosion preferably comprises a compound with a ceramic filler 153, a fluoroplastic plate 152, and a shrink tube 151. The compound with a ceramic filler 153 is applied on a brazed joint in a liquid state and fills a round recess made at the concentrator end in the area of brazing with a magnetostrictive core 61. The fluoroplastic plate 152 is preferably about 2-4 mm in thickness with a diameter equal to that of the concentrator end in the brazing area. The fluoroplastic plate 152 is mounted on the concentrator end prior to polymerization of the compound 153. The shrink tube 151 is mounted on a brazed joint and ensures subsequent heat shrinkage for the concentrator end, brazed joint, fluoroplastic plate and bottom end of the magnetostrictive core 61.

FIG. 33 shows a transducer with a means to protect the core end against cavitation erosion. The cavitation erosion protection means is mounted on a free end of the magnetostrictive core 61 and creates on the end surface of the core 61 the boundary conditions that prevent the formation and development of cavitation, as well as damage of the surface, thus extending the life of the entire transducer 40. The protection means of the magnetostrictive transducer core end protects against cavitation erosion and comprises a fluoroplastic plate 155 of about 2-4 mm in thickness with length and width corresponding to the size of the end of the magnetostrictive core 61 and a shrink tube 154 mounted on the end of the transducer core 61. The shrink tube 154 and the end of the transducer core 61 are joined together by heat shrinkage of the shrink tube 154 and affixing the fluoroplastic plate 155 on the end of the transducer core 61.

FIGS. 34(*a*) and 34(*b*) show a pin holder 34 with an insert 156, which may be a replaceable insert, positioned in the head end thereof. The replaceable insert 156 is made of a hard or antifriction metallic or non-metallic material and has at least one guide hole for at least one indenter 31. The insert 156 is held in the pin holder 34 by friction forces between the side surfaces of the insert 156 and surfaces of pin holder 34 springing grips under elastic forces excreted thereby. A thermoplastic retainer plate 32 may also be located in the pin holder 34 as described above. The replaceable insert 156 extends the life of the pin holder 34 through the use of very hard wear resistant metallic and non-metallic materials and reduces pin holder manufacturing costs.

The present invention comprises the technology of two-stage strengthening of the waveguide tip 70 by means of hardfacing (with tempering) by oxidized titanium and strengthening by ultrasonic impact treatment following machining thereof. A height of oxidized titanium hardfacing is preferably not more than 6 mm to prevent structural change of the waveguide titanium alloy in the hardfaced area due to overheating and to provide consistent acoustic properties thereof. Ultrasonic impact strengthening of a hardfaced tip provides additional hardfacing modification and introduction of favorable compressive stresses into a hardfacing to a depth of not less than 1.5 mm. Laboratory testing at axial loads of about 200-250 N at limiting amplitudes of ultrasonic displacements and initiated impacts has showed working tip durability of not less than 100 hours of continuous operation using indenters of diameters up to 9 mm. This is more than five times greater than prior known engineering solutions.

The oscillating systems and tools of the present invention may be produced in small or large batches and may be used under continuous-running manufacturing conditions for a long period of equipment operation. The output parameters thereof and technical results are characterized by high stability. Those parameters do not depend on a number of tools in the batch or time of application of each tool in the work process.

UIT tool manufacturing with the use of magnetostrictive transducers sets new tasks connected with the extension of the tool application area in up-to-date industry and production. These tasks include:

Efficiency of transducers according to the criteria of maximal use of transducer power and minimization of transducer weight and dimensions;

Oscillating system stability to specified oscillation mode under impact conditions when the tool is subjected to great dynamic and static forces;

Ensuring controlled acoustic coupling between indenter and waveguide;

Full use of elastic energy reserve stored during tool rebound;

Ensuring the energy balance in the functional system: excitation-spring-added masses-ultrasonic impact; implementing self-excitation of low-frequency impacts in the system;

Ensuring reliable damp-proof seal at the zero collar considering vibro-impact loads and Poisson movements caused by regular operation of the tool and ultrasonic oscillations of the transducer under simultaneous action of static forces, respectfully;

Increasing the life of guide holes of the pin holder during long tool operation;

Increasing the life of a technical waveguide tip under long loading; and/or

Tool universality and ergonomicity under different conditions.

An analysis of the methods for creating a strong welded butt joint between the concentrator and the core of the laminations made of permendure made it possible to find the method of junction between such heterogeneous materials by means of brazing with a fine vacuum with the use of a brazing alloy, such as an argentiferous brazing alloy, in the form of a thin plate of foil. Two methods of joining a brazed joint were developed depending on the brazing alloy compositions: (1) high-temperature brazing alloy followed by annealing of a magnetostrictive core and restoration of electro-mechanical properties thereof; and (2) low-temperature brazing alloy without any change in the electro-mechanical properties of the cores. The brazing quality in both cases is preferably achieved in a fine vacuum.

Exemplified below is the low-temperature method with extremely short brazing time, which is governed by attaining sufficient fluidity of a brazing alloy for reliable wetting of the brazed surfaces and adhesion of a brazing alloy during its crystallization. This example is illustrative and should not limit the invention.

EXAMPLE

The following materials are used for creating a permanent connection:

Brazing alloy containing 68% Ag, 27% Cu, 5% Sn,

Titanium powder to activate the brazing process and normalize the height of brazing alloy penetration.

Brazing is preferably in the SGV 2.4-2/15 type vacuum furnace with a total heating of the transducer. AgCuSn 68-27-5 argentiferous band brazing alloy having a thickness of about 0.1 mm is laid at the interfaces between the permendure core and the titanium concentrator. A thin layer of titanium powder of PTS grade with a particle size of less than 40 μm is applied on the permendure core tip. For this purpose, the core is immersed into a titanium powder suspension to a depth of 2 mm. The titanium suspension may also be applied by means of a brush wetted therewith. The following conditions were used for this example:

Brazing temperature —T=840-850° C.;

Soaking—0.5 min.;

Heating/cooling rate—17° C./min.;

Vacuum—$2 \cdot 10^{-2}$-$5 \cdot 10^{-4}$ Pa; and

Pressure—0.1-0.2 kg/mm$^2$.

The produced transducers have been tested as parts of the tools at the Northern Scientific and Technology Company (NSTC) laboratory during ultrasonic impact treatment of different materials. The transducers can stand long intensive tests and were long-term tested during UIT of actual structures.

Recently, ultrasonic deformation technologies have been characterized by severe and sometimes critical operational conditions. Conventional surface gluing of a core cannot provide sufficient acoustic stiffness (or stability) thereof. This results in short transducer service life under the new conditions. Electro-isolation of core laminations should be made to decrease whirling currents losses. These circumstances have led to searching for new materials for lamination soaking and thereby increasing core acoustic stiffness. In a preferred embodiment, a core of a passive transducer is soaked by immersion in a bath filled with liquid polymer, excited by ultrasonic oscillations of an active transducer at a resonance frequency up to full polymer wicking among laminations, thereby initiating self-polymerization in the material compound in an ultrasonic field and is heated to 90° C. The cores are preferably soaked by an ultrasonic generator having a power of up to about 200 W, at a resonance frequency of the transducer being soaked in a container with a polymeric compound where an activated core is immersed (by the conventional technology, the passive core is immersed into the ultrasonic bath). Soaking by the method of the present invention has great benefits providing high rate of soaking and application of heat (80° C.-150° C.) emitted due to ultrasound absorption for high quality and rate of compound polymerization. A transducer soaked by this method is a monolith during the whole service life. As a result, magnetostrictive and electromagnetic characteristics of the transducer do not change during the whole service life.

The present invention also relates to engineering solutions for new UIT tool creation which can stand specified acoustic and mechanical loads during long operation under continuous-running manufacturing conditions. The engineering solutions preferably include at least one of:

Providing oscillating system stability to specified oscillation mode and conditions during a change in acoustic load thereon in a wide range of resistance and Q-factor during short time intervals and under great dynamic and static loading on the tool;

Providing stability of characteristics, interchangeability of oscillating systems and adaptation thereof to continuous-running manufacturing conditions;

Providing repeatable transducer performance within a specified scatter range, but not greater than 10%;

Providing long-life transducers and limiting operating conditions for the active material, developing transducer manufacturing procedures according to these requirements, optimizing the relationship between magnetostrictor dimensions that minimizes electromagnetic and electroacoustic losses;

Optimizing oscillating velocity transformers in accordance with the criterion of limiting ultrasonic displacement amplitude under load, good matching to the generator, stable oscillations and long life during long treatment of different materials having high and low strength, high and low plasticity, high and low thermal conductivity under stationary large-scale continuous manufacturing conditions and under field conditions;

Providing stability of core magnetostrictive characteristics at a level of limiting values thereof for a given material that shows transducer excitation efficiency, transducer manufacturing quality and consistency of results when the transducer is used for ultrasonic impact treatment;

Searching for material compositions and brazed joints such that time to failure is not less than the limiting time for any material or joint under the effect of impact dynamic, ultrasonic cyclic and static stresses at the level of limiting characteristics of the materials or brazed joint;

Designing the acoustic waveguide, which manufacturing procedure provides the service life of the working tip such that the duration of continuous operation thereof until a critical condition is not less than that specified by process procedures, wherein the working tip operating under impact impulses of force that are limiting for a treated material; creating a working tip strengthening technique to achieve this;

Creating an indenter-to-waveguide press system, which improves an acoustic coupling of a waveguide-indenter pair, at the same time increasing oscillating system equivalent mass and hence, impact value;

Creating an acoustic coupling between an oscillating system and a tool, which makes possible the optimal application of energy stored during ultrasonic impact and energy transformation into a force impulse on a treated surface, an effective energy transfer into the treated material, self-synchronization between oscillations of an indenter and an oscillating system at an excitation frequency at a minimal recoil by the elastic component (a back reaction);

Developing technical waveguides with dimensions, configurations and shapes of working tips that are required and sufficient for ultrasonic impact treatment of hard-to-access areas;

Developing indenters having dimensions matched to ultrasonic transducer frequency and impact frequency in accordance with a maximal impact efficiency that is functionally related to impact time, length and porosity;

Modifying indenter working tips which have dimensions and a shape chosen according to a given configuration of a treated surface of a material or joint, especially a groove and requirements for groove quality and specifically roughness;

Designing a reliable transducer fixation in the transducer cooling case to prevent loosening under impacts and oscillations being easy to assembly and maintain;

Developing a reliable sealing along the zero collar with a thermoelastic retainer plate which is easy to mount and remove, preventing deformation thereof, using elasticity and plasticity of the retainer under action of impacts and oscillations;

Developing a reliable sealing assembly along the input/output of wires of a transducer winding with a thermoelastic retainer plate which is easy to mount and remove, preventing the sealing from failure, using elasticity and plasticity of the retainer subjected to radial pressing under action of impacts and oscillations;

Designing handles for possible tool application in different spatial positions;

Eliminating output kinks of hoses and cables when the tool is used in different spatial positions;

Designing an easy and reliable pin fixation assembly in a pin holder, retainer protection thereof from high temperature in the contact zone between indenters and the waveguide during impact;

Ensuring reliable transducer cooling when operating in different spatial positions under impact and oscillation action;

Ensuring reliable pin holder fixation when operating in different spatial positions under impact and oscillation action; and/or Ensuring reliable transducer mounting and preventing rotation thereof around its axis in the tool body and in the transducer case when operating in different spatial positions under impact and oscillation action.

The tool for ultrasonic impact treatment of the present invention also provides highly stable oscillation conditions and oscillation modes within a wide range of quasistatic and dynamic load variations, as well as a reliable and stable operation of the oscillating system of the tool during effective plastic deformation of a surface at a level of limiting properties of a treated material. This tool provides at least one engineering solution not provided by prior tools including at least one of:

oscillating system stability to a specified oscillation mode in a range of change in load resistance and Q-factor of an oscillating system "magnetostrictive transducer-transformer of oscillating velocity-treated unit" during short time periods is achieved by means of optimization of a relationship between longitudinal and transversal dimensions of laminations and a right-angled hole in a core of the transducer, and also having a concentrator configuration by change in (1) load resistance from about 3 to about 500 ohm, (2) Q-factor from about 5 to about 400, (3) amplitude of mechanical displacements up to about 100 µm, (4) static load up to yield strength, (5) dynamic load up to ultimate strength and/or (6) variable stress up to a fatigue limit of the material of any oscillating system component, increase in effective time length of an ultrasonic impact including ultrasonic impacts by at least one indenter with and without withdrawal from the treated material as a criterion proportional to plastic deformation work on the material surface and at a certain depth during an ultrasonic impact is obtained by selecting a length and diameter of the at least one indenter, and radius or radiuses of a working surface depending on the properties of the treated material to provide plastic deformation with maximal volume of indentation having a diameter or at least one dimension changing right up to a value close to indenter diameter for a unit of time set according to a predetermined treatment capacity of a treated unit by full surface coverage, increase in mass reduced to an impact point is achieved due to control of concentrator-indenter coupling, and optimization of surface treatment conditions at high requirements for a surface condition of a detail being treated which is achieved due to minimization of uncontrolled indenter rebounds, ensuring a kink-proof position of hoses and cables inside and at the output of the tool when operating under load, ensuring a predetermined treatment capacity of about 0.2 m/min. and greater to produce a radius of a groove on a weld toe, groove roughness and residual stresses sufficient for an increase of about five times and greater in workpiece fatigue resistance on an area responsible for a life time thereof which is achieved by the at least one indenter having a working two-radii wedge surface, wherein a smaller indenter radius produces toe surface radius in a groove cross-section, and a larger indenter radius produces surface roughness and a level of induced residual stresses depending on the smaller radius, increasing a core magnetostriction coefficient more than $10 \times 10^{-6}$ with a magnetostriction dispersion of less than 5% is obtained by means of production of a directed magnetic field and a domain polarization caused by a field when annealing in a range of temperatures appropriate to phase transfers of a core material structure during heating and cooling down of a core, reliability of a junction up to a strength level of a brazing alloy between a magnetostrictive core made of an iron-cobalt alloy and a concentrator made of a titanium or aluminum alloy or steel with or without thermal treatment with scatter of oscillating system electroacoustic characteristics of 5% or less is achieved due to using a brazing alloy, such as an argentiferous or other brazing alloys, during vacuum or inert gas brazing, adequate to a task surface wettability by molten brazing alloy during inert gas brazing which is obtained for short periods of time at a height of 2 mm or less, and scatter of surface properties in a batch is about 5%, centering a core and a concentrator as a means for increasing oscillating system stability to lateral modes occurrence under an action of high amplitudes of longitudinal oscillations is achieved by means of centering the core and the concentrator at an axis misalignment thereof, which is equal to or less than a half of allowance for accepted accuracy of oscillating system production, magnetostrictive transducer stability to lateral modes occurrence under an action of limiting ultrasonic displacements of a core in an ultrasonic field, and also an increase in impregnation and an increase in an impregnant polymerization rate are achieved by means of core impregnation in a polymeric compound with a steady ultrasonic field excited by a resonance active transducer through a soaked transducer activated by ultrasonic oscillations of the resonance active transducer, treating hard-to-access areas, such as slots, chinks, corners, etc., at waveguide high stability to specified oscillation modes is ensured by means of waveguides having configurations providing normal waves distribution through surfaces of equal phases normal to waveguide curvilinear geometric axis, and wavelength and consequently waveguide resonance dimensions are defined relative to this curvilinear or spatially oriented axis, providing an oscillating system in a fixed position to prevent rotation relative to the tool body during treatment, resistance to leakage and seal failure in the transducer case around the zero collar at a pressure of a cooling liquid of 2 atm and higher is achieved by means of an O-shaped rubber or elastomeric ring mounted in a rectangular socket without any deformation or applied force, the rectangular socket area being equal to a cross-sectional area of the rubber or elastomeric ring and filled with material of the rubber ring by pressing, resistance to leakage and sealing failure of wires in the wire sealing assembly at a pressure of a cooling liquid of 2 atm and greater is achieved by means of radial pressing by a cone-shaped split bushing with an elastic sealing material within, effective liquid cooling of the transducer at any power under high static and dynamic loads is ensured by means of design protection from air lock occurrence in the transducer case in any possible tool spatial position, the design protection being provided by specifying, in accordance with a task, of tool components responsible for feeding and withdrawing a cooling liquid, specifically at the expense of different lengths of tubes at inlet and outlet of a cooling liquid, reliable transducer mounting in the transducer case to a nodal collar is achieved by means of devices preventing self-unfastening and leaks under impacts and oscillations, universality and availability of the tool, wherein the tool is used in any spatial position due to having two types of handles: (1) a front handle with force transfer along the tool and possibility of rotation relative to the tool, and (2) a side handle mounted by a clamp on the tool body, reliable fixation of the at least one indenter along an oscillating system axis in guide channels of the pin holder during treatment accompanied by intensive oscillations thereof during impacts is achieved by means of quick-removal elastic retainer plates made of a thermoelastic material, and/or optimal life of waveguide output working tips is obtained by means of hardfacing and thermomechanical strengthening and ensures working capacity of 100 hours and greater of continuous operation at working tip amplitudes up to 70 µm until remachining of a waveguide.

The exemplary embodiments herein disclosed are not intended to be exhaustive or to unnecessarily limit the scope of the invention. The exemplary embodiments were chosen and described in order to explain the principles of the present invention so that others skilled in the art may practice the invention. As will be apparent to one skilled in the art, various modifications can be made within the scope of the aforesaid description. Such modifications being within the ability of one skilled in the art form a part of the present invention and are embraced by the appended claims.

What is claimed is:

1. A tool for ultrasonic impact treatment which provides stable oscillation conditions and oscillation modes within a range of quasistatic and dynamic load variations, and a reliable, consistent and stable operation of an oscillating system of the tool during effective plastic deformation of a surface at a level of limiting properties of a treated material comprising:

a magnetostrictive core or any other active element of piezo-active material with a coupled transformer of oscillating velocity and/or a concentrator with a zero collar, which together comprise a magnetostrictive or piezo-active transducer located in a transducer case;

a waveguide as a transformer of oscillating velocity, and/or a concentrator, attached to said transducer through said transformer of oscillating velocity of said transducer;

at least one indenter positioned in a guide channel and having an axial degree of freedom and dimensions to allow transferring an ultrasonic stress wave into a treated material and tool rebound from a treated material with parameters sufficient for effective plastic deformation and effect properties of said treated material;

a pin holder located in a head of said tool having at least one guide channel for said at least one indenter;

a retainer plate to fix said at least one indenter in said pin holder, said retainer plate is positioned in a slot at a tip of said pin holder;

a tool body; and a transducer cooling case positioned in a tool case with said transducer therein, wherein said tool provides at least one engineering solution, wherein said at least one engineering solution includes at least one of:

oscillating system stability to a predetermined oscillation mode in a range of change in load resistance and Q-factor of an oscillating system magnetostrictive transducer-transformer of oscillating velocity-treated unit during predetermined time periods achieved by means of optimization of a relationship between longitudinal and transversal dimensions of laminations and a right-angled hole in a core of said transducer, and also having a concentrator configuration by change in (1) load resistance from about 3 to about 500 ohm, (2) Q-factor from about 5 to about 400, (3) amplitude of mechanical displacements up to about 100 µm, (4) static load up to yield strength, (5) dynamic load up to ultimate strength and/or (6) variable stress up to a fatigue limit of said material of an oscillating system component, increase in effective time length of an ultrasonic impact including ultrasonic impacts by said at least one indenter with or without withdrawal from said treated material as a criterion proportional to plastic deformation work on said surface and at a predetermined depth during an ultrasonic impact obtained by selecting a length and diameter of said at least one indenter, and radius or radiuses of a working surface depending on properties of said treated material to provide plastic deformation with maximal volume of indentation having a diameter or at least one dimension changing right up to a value close to indenter diameter for a unit of time set according to a predetermined treatment capacity of a treated unit by full surface coverage, increase in mass reduced to an impact point is achieved due to control of concentrator-indenter coupling, and optimization of surface treatment conditions at high requirements for a surface condition of a detail being treated which is achieved due to minimization of uncontrolled indenter rebounds, ensuring a kink-proof position of hoses and cables inside and at an output of said tool when operating under load, ensuring a predetermined treatment capacity of about 0.2 m/mm. and greater to produce a groove on a weld toe, groove roughness and residual stresses sufficient for an increase of about five times and greater in workpiece fatigue resistance on an area responsible for a life time thereof which is achieved by said at least one indenter having a working two-radii wedge surface, wherein a smaller indenter radius produces toe surface radius in groove cross-section, and a larger indenter radius produces surface roughness and a level of induced residual stresses depending on said smaller radius, increasing a core magnetostriction coefficient more than $10 \times 10^{-6}$ with a magnetostriction dispersion of less than 5% obtained by means of production of a directed magnetic field and a domain polarization caused by a field when annealing in a range of temperatures appropriate to phase transfers of a core material structure during heating and cooling down of a core, junction reliability up to a strength level of a brazing alloy between a magnetostrictive core made of an iron-cobalt alloy and a concentrator made of a titanium or aluminum alloy or steel with or without thermal treatment with scatter of oscillating system electroacoustic characteristics of 5% or less achieved due to using a brazing alloy during vacuum or inert gas brazing, adequate to a task surface wettability by molten brazing alloy during inert gas brazing obtained for short periods of time at a height of 2 mm or less, and scatter of surface properties in a batch is about 5%, increasing oscillating system stability to lateral modes occurrence under an action of high amplitudes of longitudinal oscillations by means of centering a core and said concentrator at an axis misalignment thereof, which is equal to or less than half of an allowance for accepted accuracy of oscillating system production, magnetostrictive transducer stability to lateral modes occurrence under an action of limiting ultrasonic displacements of a core in an ultrasonic field, increase in impregnation, and increase in impregnant polymerization rate by means of core impregnation in a polymeric compound with a steady ultrasonic field excited by a resonance active transducer through a soaked transducer activated by ultrasonic oscillations of said resonance active transducer, treatment of hard-to-access areas at waveguide stability to predetermined oscillation modes by means of waveguides having configurations providing normal waves distribution through surfaces of equal phases normal to waveguide curvilinear geometric axis, and wavelength and waveguide resonance dimensions being defined relative to curvilinear or spatially oriented axis, provision of an oscillating system in a fixed position thereby preventing rotation relative to said tool body during treatment, resistance to leakage and seal failure in said transducer case around said zero collar at a pressure of a cooling liquid of 2 atm and higher is achieved by means of an O-shaped rubber or elastomeric ring mounted in a rectangular socket without any deformation or applied force, said rectangular socket being equal to a cross-sectional area of said rubber or elastomeric ring and filled with material of said rubber ring by pressing, resistance to leakage and sealing failure in an output sealing assembly at a pressure of a cooling liquid of 2 atm and greater by means of radial pressing by a cone-shaped split bushing with an elastic sealing material within, effective liquid cooling of said transducer at any power under high static and dynamic loads is ensured by means of design protection from air lock occurrence in said transducer case in any possible tool spatial position, said design protection being provided by specifying, in accordance with a task, of tool component responsible for feeding and withdrawing a cooling liquid, specifically at an expense of different lengths of tubes at inlet and outlet of a cooling liquid, reliable transducer mounting in said transducer case to a nodal collar by means of devices preventing self-unfastening and leaks under impacts and oscillations, universality and availability of said tool by use in any spatial position wherein said tool has two handles: (1) a front handle with force transfer along said tool, and (2) a side handle on said tool body, fixation of said at least one indenter along an oscillating system axis in guide channels of said pin holder during treatment accompanied by intensive oscillations thereof during impacts by means of elastomeric retainer plates made of a thermoelastic material, and waveguide output working tips having a working capacity of 100 hours and greater of continuous operation at working tip amplitudes up to 70 μm until first waveguide remachining by means of hardfacing and thermomechanical strengthening.

2. The tool of claim 1, further comprising:
a sealing assembly over said zero collar;
a bushing affixed to said transducer case, wherein said bushing moves longitudinally inside said tool body synchronously with said transducer case during ultrasonic impact treatment;
at least one handle affixed to said tool body;
an output sealing assembly for sealing at least one hose and/or cable in relation to said tool; and
an output for at least one hose and cable from said tool.

3. The tool of claim 1, wherein said transducer has an O-shaped magnetostrictive core, wherein maximal limiting amplitude of ultrasonic displacements of said O-shaped magnetostrictive core at a fatigue limit of core material based upon $2 \times 10^7$ and greater cycles achieved by providing a relationship between longitudinal and transversal dimensions of core laminations in a range of values equal to about ratios between: lamination width and height of about $\frac{2}{5}$, right-angled hole width and height thereof of about $\frac{2}{19}$ and right-angled hole width and lamination width of about $\frac{2}{5}$.

4. The tool of claim 1, wherein said transducer comprises a concentrator in a form of a conical-cylindrical transformer of oscillating velocity comprising a low-amplitude conical portion including said zero collar, a high-amplitude cylindrical portion having a length from about $\frac{1}{8}$ to $\frac{1}{5}$ from a wavelength at a resonance frequency of said transducer of an oscillating system, and a flute transition radius between said low-amplitude conical portion and said high-amplitude cylindrical portion, wherein a center of said flute transition radius is in a secant plane of coupling between said high-amplitude cylindrical portion and said flute transition radius, and wherein a height of a radius coupling is from about $\frac{1}{2}$ to about $\frac{1}{3}$ from a length of said high-amplitude cylindrical portion.

5. The tool of claim 1, further comprising a transducer cooling case, wherein said transducer cooling case is centered relative to said tool body and connected thereto axially by a spring so as to provide vibro-acoustic coupling during tool operation, wherein structural dimensions of a spring are pre-selected to provide a predetermined spring rate sufficient to control efficiency and energy parameters of impact to achieve, among other things, multiplicity of frequency and to provide energy balance between said tool and treated material natural oscillations initiated by ultrasonic impacts produced by an oscillating system as a part of said tool.

6. The tool of claim 1, wherein said at least one indenter has a length from about $\frac{1}{12}$ to about $\frac{1}{4}$ of a wavelength at a resonance frequency of said transducer of an oscillating system under load.

7. The tool of claim 1, wherein said at least one indenter comprises at least one cylindrical, conical or spherical indenter capable of free movement along an axis of an oscillating rate concentrator, and attached to an output tip of said concentrator with a resonance bracket at an oscillating system frequency, attached to said zero collar through a spring pressed by a controlled force of a nut upon affixing with a lock nut, wherein said nut and said lock nut are fitted on an internal thread of said resonance bracket within an antinode of displacement of said resonance bracket.

8. The tool of claim 1, wherein cooling lines and a transducer power cable extend from said tool through an output assembly and are held therein, said output assembly being mounted in a bushing at an angle ergonomic for an operator of said tool and passes through a guide slot in said tool body.

9. The tool of claim 1, wherein a working tip of said at least one indenter is wedge-shaped and has a first radius and a second radius, said first radius being about 0.5 mm and greater providing a groove radius for obtaining a predetermined coupling radius in a treatment area, said second radius being about 10 mm and greater for obtaining predetermined surface roughness of 100 microinches and less, wherein said at least one indenter achieves a level and distribution of residual stresses initiated by indenter ultrasonic impact suitable for compensation of external force action that creates risk of treated material failure in zones affected by stress concentrators during operation.

10. The tool of claim 1, wherein a magnetostrictive core of said magnetostrictive transducer is annealed in a vacuum, in an inert gas or a combination thereof with an induced constant magnetic field, affecting along a lamination plane normal to a longer side of said magnetostrictive core at a magnetic force suitable for limiting polarization of magnetic domains along said magnetostrictive core at a temperature appropriate to pass through Curie point in both directions and during cooling of said magnetostrictive core within a temperature range where a domain structure of a core material is formed.

11. The tool of claim 1, wherein a magnetostrictive core is brazed to said transformer of oscillating velocity in a vacuum up to $10^{-4}$ Pa by short-term heating and cooling at a rate of 17° C./min. using a strap brazing alloy of a thickness of about 0.1 mm and a titanium powder acting as a flux causing permendure to be wetted by brazing alloy to a height of about 0.1 mm and less of a web height at a scatter of work process and oscillating systems in a batch of 5% and less after brazing, wherein said magnetostrictive core and said transformer of oscillating velocity together comprise, after brazing, said magnetostrictive transducer.

12. The tool of claim 1, wherein a magnetostrictive core of said magnetostrictive transducer is centered along a cylindrical groove of a diameter equal to a core tip diagonal or by means of mounting said magnetostrictive core in a rectangular socket, wherein a core tip shape has a depth of 0.1 mm and less from a web height.

13. The tool of claim 1, wherein a core of a passive transducer is soaked by immersion in a bath filled with liquid polymer, excited by ultrasonic oscillations of an active transducer at a resonance frequency up to full polymer wicking among laminations, thereby initiating self-polymerization in a material compound in an ultrasonic field and heated to 90° C.

14. The tool of claim 1, wherein a uniform distribution of ultrasonic displacements on a waveguide skewed tip is obtained at a negative angle of up to 30°.

15. The tool of claim 1, wherein said waveguide is a curvilinear waveguide having a rotation of surfaces of equal phases in sections normal to centers of distributed masses forming a waveguide body, said rotation being 30° or less.

16. The tool of claim 1, wherein relative to said tool body, a fixed position of said magnetostrictive transducer and oscillating system in whole is provided, under randomly spatially oriented vibroimpact loading of the tool, by a guide key in said transducer case along said zero collar of said magnetostrictive transducer and between said magnetostrictive transducer and said tool body.

17. The tool of claim 1, further comprising a sealing assembly along said zero collar wherein said sealing assembly comprises an elastomeric ring and split collar, said split collar comprising two split removable metal semi-rings held by a lock washer, said semi-rings and said elastomeric ring being freely mounted in a socket between an internal thrust flange of said transducer case and said split collar, wherein mounting of said elastomeric ring provides (1) free mounting of said elastomeric ring, (2) free, uniformly distributed non-deformed state of said elastomeric ring, (3) filling backlashes by pressing and (4) free removal after relief from pressing without force application and deformation upon removal.

18. The tool of claim 1, further comprising:
a sealing assembly for at least one wire of said magnetostrictive transducer winding, wherein said transducer case is a transducer cooling case, said sealing assembly extends from said transducer cooling case and comprises an elastic sealing element, a cone-shaped split bushing and a thread ring being movable freely along a thread having a cone-shaped bore hole, wherein said thread ring presses said elastic sealing element under an action of radial forces when tightening relative to an axis of said cone-shaped split bushing.

19. The tool of claim 1, further comprising a cooling assembly on said magnetostrictive transducer, wherein said cooling assembly of said magnetostrictive transducer comprises:
an elastic seal;
an inlet nipple with a tube inserted in said transducer case between a magnetostrictive core of said magnetostrictive transducer and an internal wall of said transducer case, wherein a length of said tube extends beyond said magnetostrictive core of said magnetostrictive transducer; and
an outlet nipple which when installed does not extend internally beyond an end of said transducer case.

20. The tool of claim 1, wherein said magnetostrictive transducer in said tool body is fixed under an action of impacts by a thread ring having seven or more threads with a radial slot having a width of one thread pitch or greater at a distance equal to 1 to 2 thread pitches from a tip of said thread ring, and an internal conical groove on said tip on a side of said radial slot, and wherein fixation is provided by means of resting against said thread ring on a side of said groove, thereby producing additional elasticity when locking by a locking nut with seven or more threads.

21. The tool of claim 1, further comprising at least one handle affixed to said tool body, wherein said at least one handle is a front handle which has about two to three degrees of freedom for work position selection, said front handle being mounted on said tool body by clamp screws on an end of said tool body opposite to said at least one indenter.

22. The tool of claim 1, further comprising at least one handle affixed to said tool body, wherein said at least one handle is a side handle which has about two degrees of freedom for work position selection, and is mounted on a side of a cylindrical portion of said tool body and fixed by a side handle pressing clamp.

23. The tool of claim 1, wherein said retainer plate has at least one hole having a diameter about 0.5-1.0 mm smaller than a diameter of said at least one indenter and a thickness of about 0.8-1.0 mm, said retainer plate being inserted into a transversal slot of a width of about 0.8-1.5 mm in a working part of said pin holder, said transversal slot having at least one guide channel and being perpendicular to said channel.

24. The tool of claim 1, wherein an increase in waveguide working tip resistance to failure under impacts is obtained by argon-arc hardfacing with oxidized titanium to a height of about 2 to 6 mm.

25. The tool of claim 1, wherein said magnetostrictive transducer further comprises a magnetostrictive core having plates, wherein a life of said transducer and strength characteristics of a brazed joint between said magnetostrictive core and said concentrator is increased by increasing a contact area of said brazed joint through regularly staggering said plates of said magnetostrictive core with a distance between ends of adjacent plates ranging from about 0.05 mm to about 0.5 mm.

26. The tool of claim 1, wherein a round recess is made at an end of said concentrator of said magnetostrictive transducer, wherein said recess retains a molten brazing alloy during brazing in a brazed joint, prevents said brazing alloy from flowing on a side surface of said concentrator and makes possible formation of a smooth fillet around a periphery of a brazed joint.

27. The tool of claim 11, wherein brazing of said magnetostrictive core is in an induced constant magnetic field oriented along a plane of plates of said magnetostrictive core and perpendicularly to a longer side of said magnetostrictive core, wherein said magnetic field has a strength sufficient for maximum polarization of magnetic domains along said magnetostrictive core at a temperature of crossing a Curie point in both directions and during cooling of said magnetostrictive core within a temperature range where a domain structure of a core material is formed.

28. The tool of claim 1, wherein said waveguide is a conic-cylindrical waveguide, wherein a high amplitude at a working end of said conic-cylindrical waveguide and stable performance of said oscillating system under limiting dynamic and quasistatic forces are attained by said conic-cylindrical waveguide, wherein a diameter of an end of said conic-cylindrical waveguide attached to said transducer is greater than a diameter of a transducer tip attached to said conic-cylindrical waveguide.

29. The tool of claim 1, further comprising an extension resonant waveguide which enables treatment of surfaces in narrow spaces, remote areas and/or hard-to-access areas, wherein said extension resonant waveguide is centrally positioned between a tip of said transducer and an end of said waveguide, and wherein a length of said extension resonant waveguide is set multiple of a half-wave length at a carrier frequency of said transducer.

30. The tool of claim 1, wherein said waveguide is a curved waveguide which enables treatment of surfaces in narrow spaces, remote areas and/or hard-to-access areas, wherein said curved waveguide has a rectangular section and rotation angle of a plane of a working end of up to 120°, wherein said curved waveguide is formed by sections of equal phases oriented perpendicularly to a line of centers of distributed masses which form a body of said curved wave guide.

31. The tool of claim 1, wherein said waveguide is a curved waveguide, wherein said transducer case with said transducer positioned therein is mounted in said tool body by a movable pivot joint and connected with said tool body by a flat spring in a direction of rotation of said transducer case in said pivot joint so that during operation, an integrated oscillating system oscillates at a natural frequency that is synchronized with a frequency of transducer excitation pulses, wherein said integrated oscillating system comprises said transducer, said transducer case, said curved waveguide, said at least one indenter installed in said pin holder at an end of said curved waveguide and said treated material.

32. The tool of claim 1, wherein said waveguide is a curved waveguide, wherein said transducer case with said transducer positioned therein is mounted in said tool body by a pivot joint and connected with said tool body by a flat spring in a direction of rotation of said transducer case in another pivot joint so that during operation, said oscillating system oscillates at a natural frequency that is synchronized with a frequency of transducer excitation pulses, wherein said tool body is mounted on an adjustment support that allows positioning of said tool body relative to said treated material, wherein said oscillating system comprises said transducer case, said curved waveguide, said at least one indenter and said treated material.

33. The tool of claim 1, wherein said transducer case with said transducer positioned therein is connected with said tool body on two sides in a direction of an axis of said transducer by means of two springs located in a front portion and a rear portion of said transducer case so that during operation, said oscillating system oscillates at a natural frequency which is synchronized with a frequency of transducer excitation pulses, wherein said oscillating system comprises said transducer, said transducer case, said waveguide, said at least one indenter and said treated material.

34. The tool of claim 1, wherein said transducer case and a bushing rigidly attached thereto are axially connected with said tool body by means of a spring positioned between an end of said bushing and an internal end surface of said tool body, thereby providing access to said spring during assembly or spring replacement and eliminating friction between said spring, said tool body and said transducer case, thereby enhancing reliability of said tool.

35. The tool of claim 1, wherein said magnetostrictive transducer is cooled by air flow passing through said tool body and said transducer case along said oscillating system, wherein said air flow is produced by a fan built into said tool body or by a supply of compressed air from a compressed air line, cylinder or compressor.

36. The tool of claim 1, wherein said transducer is impregnated with a solution having an operating temperature of 200° C. and above.

37. The tool of claim 36, wherein said solution is a liquid organosilicon polymer.

38. The tool of claim 1, wherein a life of said transducer is extended and a brazed joint is protected against cavitation erosion by creating respective boundary conditions in an area of said brazed joint through successive application of a compound having a ceramic filler on an end of said concentrator, mounting a fluoroplastic plate thereon, compound polymerization, mounting a shrink tube in said area of said brazed joint and heating thereof to complete shrinkage and protection of said area of said brazed joint between a magnetostrictive core and said concentrator.

39. The tool of claim 1, wherein a life of said transducer is extended and an end of a magnetostrictive core is protected against cavitation erosion by creating respective boundary conditions in an area of said end of said magnetostrictive core through successive preparation of a fluoroplastic plate to match a size of said end of said magnetostrictive core, mounting said fluoroplastic plate and a shrink tube in an area of said end of said magnetostrictive core, heating said shrink tube to complete shrinkage to affix said fluoroplastic plate on said end of said magnetostrictive core.

40. The tool of claim 1, wherein a life of said pin holder is extended by using a replaceable insert made of a hard metallic or non-metallic material, wherein said replaceable insert has at least one guide hole for said at least one indenter and is held in said pin holder by friction forces between side surfaces of said replaceable insert and surfaces of pin holder springing grips under elastic forces excreted thereby.

41. A tool for ultrasonic impact treatment which provides stable oscillation conditions and oscillation modes within a range of quasistatic and dynamic load variations, and a reliable, consistent and stable operation of an oscillating system of said tool during effective plastic deformation of a surface at a level of limiting properties of a treated material comprising:

a magnetostrictive core or any other active element of piezo-active material with a coupled transformer of oscillating velocity and/or a concentrator with a zero collar, which together comprise a magnetostrictive or piezo-active transducer located in a transducer case, wherein said tool provides at least one engineering solution including at least one of:
oscillating system stability to a predetermined oscillation mode in a range of change in load resistance and Q-factor of an oscillating system magnetostrictive transducer-transformer of oscillating velocity-treated unit during predetermined time periods achieved by means of optimization of a relationship between longitudinal and transversal dimensions of laminations and a right-angled hole in a core of said transducer, and also having a concentrator configuration by change in (1) load resistance from about 3 to about 500 ohm, (2) Q-factor from about 5 to about 400, (3) amplitude of mechanical displacements up to about 100 µm, (4) static load up to yield strength, (5) dynamic load up to ultimate strength and/or (6) variable stress up to a fatigue limit of said material of an oscillating system component,
junction reliability up to a strength level of a brazing alloy between a magnetostrictive core made of an iron-cobalt alloy and a concentrator made of a titanium or aluminum alloy or steel with or without thermal treatment with scatter of oscillating system electroacoustic characteristics of 5% or less achieved due to using a brazing alloy during vacuum or inert gas brazing, adequate to a task surface wettability by molten brazing alloy during inert gas brazing obtained for short periods of time at a height of 2 mm or less, and scatter of surface properties in a batch is about 5%,
increasing oscillating system stability to lateral modes occurrence under an action of high amplitudes of longitudinal oscillations by means of centering a core and said concentrator at an axis misalignment thereof, which is equal to or less than half of an allowance for accepted accuracy of oscillating system production, and/or
magnetostrictive transducer stability to lateral modes occurrence under an action of limiting ultrasonic displacements of a core in an ultrasonic field, increase in impregnation, and increase in impregnant polymerization rate by means of core impregnation in a polymeric compound with a steady ultrasonic field excited by a resonance active transducer through a soaked transducer activated by ultrasonic oscillations of said resonance active transducer.

42. A tool for ultrasonic impact treatment which provides stable oscillation conditions and oscillation modes within a range of quasistatic and dynamic load variations, and a reliable, consistent and stable operation of an oscillating system of said tool during effective plastic deformation of a surface at a level of limiting properties of a treated material comprising:

a magnetostrictive core or any other active element of piezo-active material with a coupled transformer of oscillating velocity and/or a concentrator with a zero collar, which together comprise a magnetostrictive or piezo-active transducer located in a transducer case; and a cooling assembly of said magnetostrictive transducer providing cooling stability of said tool, wherein said cooling assembly of said magnetostrictive transducer comprises:

an elastic seal;

an inlet nipple with a tube inserted in said transducer case between a magnetostrictive core of said magnetostrictive transducer and an internal wall of said transducer case, wherein a length of said tube extends beyond said magnetostrictive core of said magnetostrictive transducer; and an outlet nipple which when installed does not extend internally beyond an end of said transducer case.

43. A tool for ultrasonic impact treatment which provides stable oscillation conditions and oscillation modes within a range of quasistatic and dynamic load variations, and a reliable, consistent and stable operation of an oscillating system of said tool during effective plastic deformation of a surface at a level of limiting properties of a treated material comprising:

at least one indenter; and a magnetostrictive core or any other active element of piezo-active material with a coupled transformer of oscillating velocity and/or a concentrator with a zero collar, which together comprise a magnetostrictive or piezo-active transducer located in a transducer case, wherein said tool provides impact resistance coordination and an increase in effective time length of an ultrasonic impact including ultrasonic impacts by said at least one indenter with or without withdrawal from said treated material as a criterion proportional to plastic deformation work on a material surface and at a certain depth during an ultrasonic impact obtained by selecting a length and diameter of said at least one indenter, and radius of a working surface depending on properties of said treated material to provide plastic deformation with maximal volume of indentation having a diameter or at least one dimension changing right up to a value close to indenter diameter for a unit of time set according to a predetermined treatment capacity of a treated unit by full surface coverage.

* * * * *